United States Patent
Aubele et al.

(10) Patent No.: US 8,879,046 B2
(45) Date of Patent: Nov. 4, 2014

(54) METHOD FOR MOVING AN OPTICAL ELEMENT OF A PROJECTION EXPOSURE APPARATUS FOR MICROLITHOGRAPHY

(71) Applicant: Carl Zeiss SMT GmbH, Oberkochen (DE)

(72) Inventors: Karl-Eugen Aubele, Geislingen/Steige (DE); Sven Ulmer, Aalen (DE); Klaus Rief, Aalen-Oberalfingen (DE); Marco Jassmann, Neresheim-Dorfmerkingen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 14/085,572

(22) Filed: Nov. 20, 2013

(65) Prior Publication Data

US 2014/0078487 A1 Mar. 20, 2014

Related U.S. Application Data

(63) Continuation of application No. PCT/EP2012/058593, filed on May 10, 2012.

(30) Foreign Application Priority Data

May 30, 2011 (DE) .................. 10 2011 076 685

(51) Int. Cl.
  G03B 27/72 (2006.01)
  G03B 27/54 (2006.01)
  G03F 7/20 (2006.01)
  G02B 7/00 (2006.01)
  H02N 2/02 (2006.01)
  H02N 2/06 (2006.01)

(52) U.S. Cl.
  CPC ............ G03F 7/70191 (2013.01); H02N 2/021 (2013.01); G03F 7/70258 (2013.01); H02N 2/06 (2013.01); G03F 7/70825 (2013.01); G02B 7/005 (2013.01)
  USPC ............................................. 355/71; 355/67

(58) Field of Classification Search
  CPC .................... G03F 7/70191; G03F 7/70825
  USPC .............. 355/52, 53, 55, 67–71; 359/820–824
  See application file for complete search history.

(56) References Cited

U.S. PATENT DOCUMENTS

| 6,191,898 | B1 | 2/2001 | Trunz et al. |
| 6,337,532 | B1 | 1/2002 | Johansson et al. |
| 7,173,363 | B2 | 2/2007 | Hendriks et al. |
| 7,304,717 | B2 | 12/2007 | Hummet et al. |
| 7,791,826 | B2* | 9/2010 | Bieg et al. ............. 359/819 |
| 2003/0063268 | A1 | 4/2003 | Kneer et al. |
| 2009/0244509 | A1* | 10/2009 | Limbach et al. ............ 355/67 |

FOREIGN PATENT DOCUMENTS

| EP | 851304 A2 | 7/1998 |
| WO | WO 2007/062794 A1 | 6/2007 |

OTHER PUBLICATIONS

International Search Report for corresponding PCT Appl No. PCT/EP2012/058593, dated Aug. 30, 2012.

* cited by examiner

Primary Examiner — Hung Henry Nguyen
(74) Attorney, Agent, or Firm — Fish & Richardson P.C.

(57) ABSTRACT

A projection exposure apparatus for microlithography includes an optical element actuatable by a first and a second actuator. The actuators are controlled via control intervals in such a way that a minimum deflectability predefined in accordance with a preselectable parameter is guaranteed at every point in time of the control.

20 Claims, 15 Drawing Sheets

METHOD FOR MOVING AN OPTICAL ELEMENT OF A PROJECTION EXPOSURE APPARATUS FOR MICROLITHOGRAPHY

CROSS-REFERENCE TO RELATED APPLICATIONS

The present application is a continuation of, and claims benefit under 35 USC 120 to, international application PCT/EP2012/058593, filed May 10, 2012, which claims benefit under 35 USC 119 of German Application No. 10 2011 076 685.5, filed May 30, 2011. The entire disclosure of international application PCT/EP2012/058593 is incorporated by reference herein.

The invention relates to a projection exposure apparatus for microlithography comprising an optical element and a manipulator for deflecting the optical element in at least one degree of freedom.

Furthermore, the invention relates to a method for moving an optical element of a projection exposure apparatus for microlithography, wherein the optical element is deflected by a manipulator in at least one degree of freedom.

Furthermore, the invention relates to a method for operating a projection exposure apparatus for microlithography, wherein the projection exposure apparatus is one of the type mentioned above, or an optical element of the projection exposure apparatus is deflected in the manner mentioned above.

Furthermore, the invention relates to a method for calibrating a manipulator of a projection exposure apparatus for microlithography.

Finally, the invention relates to a projection exposure apparatus for microlithography which is equipped for carrying out the above methods.

Projection exposure apparatuses for microlithography, hereinafter called projection exposure apparatuses for short, generally consist of a light source, an illumination system, which processes the light rays emitted by the light source to form illumination light, an object to be projected, generally called reticle or mask, a projection lens, hereinafter called lens for short, which images an object field onto an image field, and a further object, onto which projection is effected, generally called wafer. The mask or at least part of the mask is situated in the object field and the wafer or at least part of the wafer is situated in the image field. If the mask is situated completely in the region of the object field, and the wafer is exposed without a relative movement of wafer and image field, then the projection exposure apparatus is generally referred to as wafer stepper. If only part of the mask is situated in the region of the object field, and the wafer is exposed during a relative movement of wafer and image field, then the projection exposure apparatus is generally referred to as a wafer scanner.

Projection exposure apparatuses are generally equipped with manipulation possibilities which ensure that the functionality of the projection exposure apparatus is maintained over its lifetime and optimum operation is achieved for different customer requirements. The impingement of illumination light on the optical elements of the lens leads to the heating and degradation of the optical elements and thus to the alteration of their optical properties. This alteration of the optical properties generally leads to an impediment of the imaging capacity of the lens and thus of the projection exposure apparatus. Therefore, some of the optical elements of the lens are equipped with manipulation possibilities which alter their relative position with respect to other optical elements of the lens.

EP851304A2 provides a pair of aspherized plane plates, so-called Alvarez plates, which exhibit no optical effect in a predefined spatial zero position, but exhibit a precalculated optical effect in the event of a translational relative movement with respect to one another. Furthermore, US20030063268A1 and U.S. Pat. No. 6,191,898B1 disclose the manipulation of optical elements in projection optical units, wherein the optical elements are displaced by manipulators in the direction of an optical axis of the lens or orthogonally with respect thereto, such that an optical effect is established by this relative movement with respect to further optical elements belonging to the lens. Finally, WO2007062794A1 discloses the manipulation of an optical element of a lens, wherein the lens contains an optical axis. In this case, the optical element is moved in five spatial degrees of freedom: displacement in the direction of an optical axis of the lens, two displacements perpendicularly thereto, and two rotational movements about axes which do not correspond to the optical axis.

In one preferred embodiment, the abovementioned manipulators for deflecting an optical element in a degree of freedom which, in particular, corresponds to a relative displacement of the optical element with respect to further optical elements of the lens are equipped with actuators which realize the deflection of the optical element. Actuators used include, in particular, linear drives comprising piezo elements for example. The latter, triggered by a change in a voltage present at the piezo crystal, bring about expansion or shearing of the piezo crystal or a piezo stack. The term stroke piezo is employed in the case of an expansion, and shear piezo in the case of a shearing. The position of the optical element is thereby altered, directly or indirectly.

The functioning of these linear drives constructed using piezo elements for deflecting an optical element of a projection exposure apparatus for microlithography is based on two different functional modes of the underlying actuator concept. In this respect, cf. FIGS. 3a-3f of U.S. Pat. No. 7,304,717B2 and FIG. 4a of U.S. Pat. No. 7,173,363. A distinction is drawn in an (i) analogue mode, in which the shear piezos associated with the actuator are deflected, and their shearing indirectly brings about a direct deflection of the optical element. If the shear piezos attain their maximum deflection, then a change is made to a (ii) stepping mode, in which the shear piezos return to their starting position without the position of the optical element being altered. An essential element of the stepping mode is the engagement changeover from a first pair of shear piezos onto an armature to a second pair of shear piezos onto the armature.

The above-explained functioning of the linear drive for deflecting an optical element of a projection exposure apparatus for microlithography suffers from the following two disadvantages:

Upon attaining the maximum shearing of the shear piezo engaged with the armature, it is necessary to change to the stepping mode for further deflection of the optical element. This has to be carried out completely in order to return the shear piezo completely to its starting position. This entails the disadvantage that, upon attaining the maximum shearing of the shear piezo, it is not possible for the optical element to be temporally directly deflected further in the currently desired direction of movement. Rather, a pause is required, in which the engagement changeover of the stepping mode is carried out and in which the optical element does not alter its position. This has two disadvantages:

(a) At the point in time of the engagement changeover, new information about the desired position of the optical element might be present, which information would make it appear desirable to effect only a small alteration of the position of the optical element from the current position. This cannot be carried out since the actuator is in the stepping mode.

(b) The acceleration of the shear piezos and the engagement changeover from a first shear piezo engaged onto the armature to a second shear piezo engaged onto the armature result in a force input into the armature and thus an undesired and possibly uncontrolled additional alteration of the position of the optical element.

Therefore, there is a need to improve the above-explained linear drives—presented in the documents U.S. Pat. No. 7,304,717B2 and U.S. Pat. No. 7,173,363—for moving an optical element in a projection exposure apparatus for microlithography.

The document U.S. Pat. No. 6,337,532B1 is concerned with various possible mechanisms for driving linear drives of the type presented.

Since the concept that follows the invention for the driving according to the invention of two actuators of a manipulator for deflecting an optical element of a projection exposure apparatus for microlithography is not restricted to the embodiment of a linear drive/a use of piezo elements in the actuators, the invention is presented more generally in the following formulations. In order not to place an additional burden on the presentation, which is complicated anyway, the description of the return of the individual actuators or the piezos to the starting positions thereof is dispensed with and only the following "convolution of the analogue modes" is described.

Formulation 1. Projection exposure apparatus for microlithography comprising
an optical element,
a manipulator for deflecting the optical element in a degree of freedom, the manipulator comprising
a first actuator and a second actuator for deflecting the optical element in a direction and counter to the direction of the degree of freedom, the first actuator being controllable by a first variable $\alpha_1$ from a first control range $[a_1, b_1]$ with a minimum deflection of the optical element in the direction of the degree of freedom by the control in direction $a_1$ and with a maximum deflection of the optical element in the direction of the degree of freedom by the control in direction $b_1$, the second actuator being controllable by a second variable $\alpha_2$ from a second control range $[a_2, b_2]$ with a minimum deflection of the optical element in the direction of the degree of freedom by the control in direction $a_2$ and with a maximum deflection of the optical element in the direction of the degree of freedom by the control in direction $b_2$,
and a control device for controlling the actuators in the control ranges $[a_1, b_1]$ and $[a_2, b_2]$, respectively,
characterized in that
the manipulator contains a memory for storing a convolution parameter $\alpha$ where $$0 < \alpha < \frac{1}{2}\min\{b_1 - a_1, b_2 - a_2\}$$

(minimum condition)
and
for all controls performed by the control $\alpha_1$ from $[a_1, b_1]$ and $\alpha_2$ from $[a_2, b_2]$ for deflecting the optical element in the direction of the degree of freedom, the following conditions A to D hold true:

A If $\alpha_1 < a_1 + \alpha$ then $\alpha_2 > b_2 - \alpha$ and the first and second actuators jointly deflect the optical element,
B If $\alpha_1 > b_1 - \alpha$ then $\alpha_2 < a_2 + \alpha$ and the first and second actuators jointly deflect the optical element,
C If $a_1 + \alpha \leq \alpha_1 \leq b_1 - \alpha$ the first actuator deflects the optical element,
D If $a_2 + \alpha \leq \alpha_2 \leq b_2 - \alpha$ the second actuator deflects the optical element.

A projection exposure apparatus according to formulation 1 addresses the above problem (a). At a point in time of the deflection of the optical element in the direction of the degree of freedom by the first actuator, the control of the first actuator can assume the values $\alpha_1$ from $[a_1, a_1 + \alpha)$, $[a_1 + \alpha, b_1 - \alpha]$ or $(b_1 - \alpha, b_1]$. Hereinafter, the parameter $\alpha_i$, $i = 1, 2$ of the control is identified with the magnitude of the deflection of the actuator in a simplifying manner. If $\alpha_1$ from $[a_1 + \alpha, b_1 - \alpha]$, according to C the first actuator deflects the optical element and can be deflected further both in the direction of the degree of freedom and oppositely thereto at least by the value $\alpha$. If $\alpha_1$ from $[a_1, a_1 + \alpha)$, on the basis of A the optical element is deflected by the first actuator and, on the basis of the above minimum condition, can be deflected further in the direction of the degree of freedom by at least the value $\alpha$. In this case, the optical element is additionally deflected by the second actuator only until the latter threatens to exceed its control range beyond $b_2$. Accordingly, this results in a possible deflection by at least $\alpha$ in the direction counter to the direction of the degree of freedom by the second actuator on the basis of A in conjunction with the minimum condition. If $\alpha_1$ from $(b_1 - \alpha, b_1]$ and for the case where the second actuator deflects the optical element, an analogous argumentation arises. It thus follows that at any point in time of a deflection of the optical element by at least one of the two actuators according to conditions A to D in conjunction with the minimum condition, a further deflection of the optical element directly and at least by the value $\alpha$ is possible.

Accordingly, for an arbitrary control state of the manipulator in any direction of the degree of freedom, it is possible to guarantee a minimum deflection by $\alpha$ in the direction or counter to the direction of the degree of freedom. If $\alpha$ is chosen to be large in the context of the minimum condition, then this minimum deflection advantageously increases.

Formulation 2. Projection exposure apparatus according to formulation 1, characterized in that the first and second actuators are of identical design and, apart from batch variation, $a_1 = a_2$, $b_1 = b_2$ hold true.

In the case of a projection exposure apparatus according to formulation 2, the minimum condition is presented in a simplified manner as $$0 < \alpha < \frac{1}{2}\min(b_1 - a_1).$$

The identical design of both actuators additionally allows more cost-effective production.

Formulation 3. Projection exposure apparatus according to either of formulations 1 and 2, characterized in that
for all values $0 \leq t \leq 1$ of a parameter t it holds true that
E from the control $\alpha_1 = t(a_1 + \alpha) + (1-t)a_1$ there follows the control $\alpha_2 = (1-t)(b_2 - \alpha) + tb_2$,
F from the control $\alpha_1 = tb_1 + (1-t)(b_1 - a)$ there follows the control $\alpha_2 = (1-t)a_2 + t(a_2 + \alpha)$,
G from the control $\alpha_1 = (1-t)(a_1 + \alpha) + t(b_1 - \alpha)$ there follows the control $\alpha_2 = (1-t)b_2 + ta_2$.

In the case of a projection exposure apparatus according to formulation 3, on account of the proportionality of the controls of the first and second actuators, it is possible to use a common control signal for controlling the two actuators, which overall reduces the control complexity and avoids parasitic force or impulse inputs into the manipulator which stem from undesired differences between the controls of the first and second actuators.

Formulation 4. Projection exposure apparatus according to any of the preceding formulations, characterized in that
the degree of freedom is the location of the optical element, or
the degree of freedom is the location of the optical element and the first actuator is controllable by an additional first control range $[a_1^v, b_1^v]$, and the second actuator is controllable by an additional second control range $[a_2^v, b_2^v]$, wherein the velocity of the optical element is controllable as additional degree of freedom of the optical element by control of the controls in the additional control ranges and in cases A and B from formulation 1 the control can be effected by the additional control ranges in such a way that the velocity of the first actuator is equal to the velocity of the second actuator, or
the degree of freedom is the location of the optical element and the first actuator is controllable by an additional first control range $[a_1^v, b_1^v]$, and the second actuator is controllable by an additional second control range $[a_2^v, b_2^v]$, wherein the velocity of the optical element is controllable as additional degree of freedom of the optical element by control of the controls in the additional control ranges and in cases A and B from formulation 1 the control can be effected by the additional control ranges in such a way that the velocity of the first actuator is equal to the velocity of the second actuator, and the first actuator is controllable by a further additional first control range $[a_1^a, b_1^a]$, and the second actuator is controllable by a further additional second control range $[a_2^a, b_2^a]$, wherein the acceleration of the optical element is controllable as further additional degree of freedom of the optical element by control of the controls in the further additional control ranges and, given the presence of the controls $\alpha_1 = a_1 + \alpha$ or $\alpha_1 = \beta_1 - \alpha$ for the first actuator, the control can be effected by the further additional control ranges in such a way that the acceleration of the first actuator is equal to the acceleration of the second actuator.

In the case of a projection exposure apparatus according to formulation 4, the optical element can be adjusted with regard to its location and thus with regard to its relative position with respect to other optical elements. As a result it is possible, as explained above, to counteract a possible impediment of the imaging performance of the lens and thus of the projection exposure apparatus. As a result of the additional control ranges which serve for controlling the velocity and the acceleration of the optical element as additional degrees of freedom, the deflection and thus the local displacement of the optical element can be brought about in a manner free of impulses and forces which would occur a priori upon deflection of the optical element firstly by the first actuator and then by the second actuator if these are controlled in accordance with cases A and B. More precisely: the velocity or the velocity and the acceleration is/are controlled in cases A and B under the condition that they are identical for both actuators. If, according to formulation 2, both actuators are of identical design and, as in the case of the control of the deflection, the deflection of the optical element is identified with the control, the velocities and the accelerations of the deflections are also identified with those of the additional and further additional control ranges and it holds true that $[a_1^v, b_1^v] = [a_2^v, b_2^v]$ and $[a_1^a, b_1^a] = [a_2^a, b_2^a]$. Thus, a requirement corresponding to E and F imposed on the controls $[a_1^v, b_1^v]$ and $[a_2^v, b_2^v]$ ensures that, at the times when both actuators deflect the optical element, no impulse caused by different velocities of the actuators acts on the optical element. The same correspondingly applies to the controls $[a_1^a, b_1^a]$ and $[a_2^a, b_2^a]$ and a force action.

Formulation 5. Projection exposure apparatus according to any of formulations 1 to 4, characterized in that
the manipulator contains
    an outer mount,
    an inner mount, and
    the first actuator contains a first shear piezo and the second actuator contains a second shear piezo,
wherein
    the inner mount holds the optical element,
    the two shear piezos are connected to the outer mount, and
    the optical element is deflectable via frictional engagement between the shear piezos and the inner mount and shearing of the shear piezos in the direction of the degree of freedom.

In the case of a projection exposure apparatus according to formulation 5, the actuators contain shear piezos, cf. U.S. Pat. No. 7,304,717B2 and U.S. Pat. No. 7,173,363. According to formulation 1, in each of cases A-D at least one of the two shear piezos ensures that the optical element can be deflected by the shearing of the shear piezo by at least $\alpha$ in the direction of the degree of freedom or counter to the direction. In this case, in accordance with the case differentiation with respect to formulation 1, a case-by-case analysis is effected as to whether, if necessary, the frictional engagement of one of the two shear piezos, for example of the shear piezo of the first actuator, must be released upon reaching a limit $a_1$ or $b_1$ of its control range $[a_1, b_1]$. The same correspondingly applies to the second actuator with the second shear piezo. In accordance with U.S. Pat. No. 7,304,717B2 and U.S. Pat. No. 7,173,363, the inner mount comprises an armature at which the frictional contact with the shear piezos is produced.

Formulation 6. Projection exposure apparatus according to formulation 5, characterized in that
    the first actuator contains a first stroke piezo and the second actuator contains a second stroke piezo,
wherein
    the frictional engagement can be effected by stroke movement of in each case at least one of the stroke piezos in an orthogonal direction relative to the direction of the degree of freedom.

In the case of a projection exposure apparatus according to formulation 6, stroke piezos produce the frictional engagement of the shear piezos with the inner mount, cf. U.S. Pat. No. 7,304,717B2 and U.S. Pat. No. 7,173,363. The fact that the stroke movement is brought about in a direction which is orthogonal to that of the degree of freedom has the consequence that the stroke movement has no or only a small influence on the shear movement of the shear piezos and thus on the accuracy of the deflection of the optical element.

Formulation 7. Projection exposure apparatus according to formulation 5 or formulation 6,
characterized in that
the control range corresponds to the voltages usable for the shearing of at least one of the shear piezos and the voltage $b_2$ corresponds to the maximum shearing of the shear piezo, or the control range corresponds to the voltages usable for the shearing of at least one of the shear piezos and the voltage $b_2$ corresponds to the maximum shearing of the shear piezo and the additional control range corresponds to the velocities, usable for the velocity of the shearing, of voltage changes of the shear piezo and the voltage change $b_2^v$ corresponds to the maximum possible velocity of the shear piezo, or the control range corresponds to the voltages usable for the shearing of at least one of the shear piezos and the control $b_2$ corresponds to the maximum voltage of the shear piezo and the additional control range corresponds to the velocities, usable for the velocity of the shearing, of voltage changes of at least one of the shear piezos and the control $b_2^v$ corresponds to the maximum possible velocity of the shear piezo and the further additional control range corresponds to the velocity of voltage changes that is usable for the acceleration of the shearing of at least one of the shear piezos, and the control $b_2^a$ corresponds to the maximum possible acceleration of the shear piezo.

In the case of a projection exposure apparatus according to formulation 7, the controls of the shear piezos correspond to voltages, velocities of voltage changes and accelerations of voltage changes of the shear piezos. For this purpose, for each shear piezo an individual voltage supply is used for controlling all of its two or three control ranges.

Formulation 8. Projection exposure apparatus according to formulation 6 and formulation 7, characterized in that the first stroke piezo is controllable by a third control range $[c_1, d_1]$ with voltages usable for the stroke movement and the control $d_1$ corresponds to the maximum stroke movement of the stroke piezo, and the first stroke piezo is controllable by an additional third control range $[c_1^v, d_1^v]$ with velocities of voltage changes that are usable for the stroke movement, and the control $d_1^v$ corresponds to the maximum velocity of the stroke movement of the stroke piezo and the first stroke piezo is controllable by a further additional third control range $[c_1^a, d_1^a]$ with accelerations of voltage changes that are usable for the stroke movement, and the control $d_1^a$ corresponds to the maximum usable acceleration of the stroke movement of the stroke piezo, and the second stroke piezo is controllable by a fourth control range $[c_2, d_2]$ with voltages usable for the stroke movement and the control $d_2$ corresponds to the maximum stroke movement of the stroke piezo, and the second stroke piezo is controllable by an additional fourth control range $[c_2^v, d_2^v]$ with velocities of voltage changes that are usable for the stroke movement, and the control $d_2^v$ corresponds to the maximum velocity of the stroke movement of the stroke piezo and the second stroke piezo is controllable by a further additional fourth control range $[c_2^a, d_2^a]$ with accelerations of voltage changes that are usable for the stroke movement, and the control $d_2^a$ corresponds to the maximum usable acceleration of the stroke movement of the stroke piezo.

In the case of a projection exposure apparatus according to formulation 8, the controls of the stroke piezos correspond to voltages, velocities of voltages changes and accelerations of voltage changes of the stroke piezos. For this purpose, for each stroke piezo an individual voltage supply is used as control of all of its two or three control ranges. The statements made above according to formulation 4 in conjunction with formulation 7 with respect to the control of velocity and acceleration of the shear piezos and the effects thereof on impulses and forces that act on the optical element also apply to the control of the velocity and acceleration of the stroke piezos, except that in the case of the latter impulse and force do not act in the direction of movement of the optical element, but rather orthogonally with respect thereto. Thus, not only is the accuracy of the deflection of the optical element influenced positively, since the frictional engagement of the two shear piezos is identical for both actuators in cases A and B and the inner ring or the armature is not acted on by the stroke piezos with a torque, but generally the inner ring or the armature is kept free of parasitic forces and impulses caused by the stroke piezos producing frictional contact.

Formulation 9. Method for moving an optical element of a projection exposure apparatus for microlithography according to any of formulations 1 to 8, characterized in that the following successive method steps are carried out (i) Predefinition of the convolution parameter $\alpha$, (ii) Deflection of the optical element solely by the first actuator in the direction of the degree of freedom by increasing the first variable $\alpha_1$ in the range $(a_1+\alpha, b_1-\alpha)$ toward the value $b_1-\alpha$, (iii) Control of the first variable $\alpha_1$ with $b_1-\alpha$ and control of the second variable $\alpha_2$ with $a_2$, (iv) Deflection of the optical element by the first actuator and the second actuator in the direction of the degree of freedom by increasing the first variable toward the value $b_1$ and the second variable $\alpha_2$ in the range $(a_2, b_2)$ toward the value $a_2+\alpha$, (v) Control of the first variable $a_1$ with $b_1$ and control of the second variable $\alpha_2$ with $a_2+\alpha$, (vi) Deflection of the optical element solely by the second actuator by further increasing the second variable $\alpha_2$ in the range $(a_2+\alpha, b_2-\alpha)$ toward the value $b_2-\alpha$, (vii) Control of the second variable $\alpha_2$ with $b_2-\alpha$ and control of the first variable $\alpha_1$ with $a_1$, (viii) Deflection of the optical element by the first actuator and the second actuator in the direction of the degree of freedom by increasing the second variable toward the value $b_2$ and the first variable $\alpha_1$ in the range $(a_1, a_1+\alpha)$ toward the value $a_1+\alpha$, (ix) Control of the second variable $\alpha_2$ with $b_2$, (x) Deflection of the optical element solely by the first actuator in the direction of the degree of freedom by further increasing the first variable $\alpha_1$ in the range $(a_1+\alpha, b_1-\alpha)$ toward the value $b_1-\alpha$.

A method according to formulation 9 involves representing the control sequence of the first and second actuators for a deflection of the optical element by the two actuators. After the end of the cycle, the control of the first actuator and also of the second actuator is in the starting range again, with the result that an iterative control is possible. According to arguments following formulation 1, a control and thus a deflection of the optical element in the direction of the degree of freedom or in the opposite direction by at least $\alpha$ can be controlled at any point in the control sequence. In the method described above, the parameter $\alpha$ can be set anew or remain unchanged for each cycle. In this case, preferably in the case of an increase in the parameter $\alpha$ the increase is performed during a control step in which both actuators jointly deflect the optical element, while in the case of a decrease in the parameter $\alpha$ the decrease is performed during a control step in which only one of the two actuators deflects the optical element.

In the case of an $\alpha$ chosen to be large in the context of the minimum condition, as already mentioned, the deflectability without the requirement of an actuator change is advantageously large. A prerequisite for a cyclic sequence of the method according to the formulation 9 is that in the case where only one actuator deflects the optical element, the other actuator is returned. To put it more precisely, the following hold true in the cyclic implementation of the method according to formulation 9 in parallel with steps (ii) and (vi)

(ii') Return of the second actuator by reducing the variable $\alpha_2$ to the value $a_2$.

(vi') Return of the first actuator by reducing the variable $\alpha_1$ to the value $a_1$.

Formulation 10. Method according to formulation 9, characterized in that
$0.2\cdot(b_1-a_1)<\alpha<0.5\cdot(b_1-a_1)$, or $0.1\cdot(b_1-a_1)<\alpha\leq 0.2\cdot(b_1-a_1)$, or $0<\alpha\leq 0.1\cdot(b_1-a_1)$ is set.

In the case of a method according to formulation 10, the parameter $\alpha$ is adapted to possibly changing circumstances which require an adaptation of the range in which the optical element is intended to be deflectable at any time.

Formulation 11. Method according to formulation 9 or formulation 10 for moving an optical element of a projection exposure apparatus for microlithography according to formulation 4 and any of formulations 4 to 8,
characterized in that
during method steps (iii), (v), (vii) and (ix) the following control of the additional control ranges holds true:

Control of the first actuator in the additional first control range $[a_1^v, b_1^v]$ simultaneously with the control in the first control range $[a_1, b_1]$ and control of the second actuator in the additional second control range $[a_2^v, b_2^v]$ simultaneously with the control in the second control range $[a_2, b_2]$,
wherein
during the control of the first variable with $b_1-\alpha$ the velocity controlled at this point in time from the additional first control range $[a_1^v, b_1^v]$ corresponds to the velocity controlled at this point in time from the additional second control range $[a_2^v, b_2^v]$,
or
control of the first actuator in the additional first control range $[a_1^v, b_1^v]$ simultaneously with the control in the first control range $[a_1, b_1]$ and control of the second actuator in the additional second control range $[a_2^v, b_2^v]$ simultaneously with the control in the second control range $[a_2, b_2]$,
wherein
during the control of the first variable with $b_1-\alpha$ the velocity controlled at this point in time from the additional first control range $[a_1^v, b_1^v]$ corresponds to the velocity controlled at this point in time from the additional second control range $[a_2^v, b_2^v]$,
and
control of the first actuator in the further additional first control range $[a_1^a, b_1^a]$ simultaneously with the control in the first control range $[a_1, b_1]$ and control of the second actuator in the further additional second control range $[a_2^a, b_2^a]$ simultaneously with the control in the second control range $[a_2, b_2]$,
wherein
during the control of the first variable with $b_1-\alpha$ the acceleration controlled at this point in time from the further additional first control range $[a_1^a, b_1^a]$ corresponds to the velocity controlled at this point in time from the further additional second control range $[a_2^a, b_2^a]$.

In the case of a method according to formulation 11, at the point in time of the method according to formulation 9 at which the change from the deflection of the optical element by the first actuator to a deflection of the optical element by the first actuator together with the second actuator takes place, that is to say method step (iii), the velocity of the actuators is controlled in such a way that they are identical, such that no additional impulse impingement on the optical element occurs. The same correspondingly applies to method steps (v), (vii) and (ix) and to the acceleration of the actuators and the avoidance of force impingement.

Formulation 12. Method according to formulation 9 and any of formulations 9 to 11 for moving an optical element of a projection exposure apparatus for microlithography according to formulation 5 and any of formulations 5 to 7.

In the case of a method according to formulation 12, the actuators contain shear piezos which bring about the deflection of the optical element by virtue of the fact that they shear as a result of variation of the voltage applied to them. The control ranges are voltages, velocities of voltage changes and accelerations of voltage changes. The frictional contact is produced and released again by the stroke movements of the stroke piezos.

Formulation 13. Method according to formulation 9 and any of formulations 9 to 11 for moving an optical element of a projection exposure apparatus for microlithography according to formulation 5 and any of formulations 5 to 7.

Formulation 14. Method according to any of the preceding formulations 10 to 13 for moving an optical element of a projection exposure apparatus for microlithography according to formulation 2,
characterized in that
after the end of the method steps listed in one of the methods according to formulations 10 to 13, the method steps are performed further cyclically by interchanging the roles of first and second actuators.

A method according to formulation 14 enables an a priori unrestricted deflection of the manipulator and thus the deflection of the optical element in the direction and counter to the direction of the degree of freedom. In this case, the interchange of the roles of first and second actuators should be interpreted such that the conditions imposed on the first and second actuators in the respective formulations now hold true in an interchanged manner for both actuators.

Formulation 15. Method according to formulation 14 for moving an optical element of a projection exposure apparatus for microlithography according to formulation 2,
characterized in that
the convolution parameter is set to a value from $$\alpha \in \left[\frac{1}{10}\min\{b_1-a_1, b_2-a_2\}, \frac{1}{4}\min\{b_1-a_1, b_2-a_2\}\right].$$

In the case of a method according to formulation 15, the convolution parameter is set to a value which, on the one hand, both sets the deflection $\alpha$ that is constantly achievable without an actuator change to the value $$\frac{1}{10}\min\{b_1-a_1, b_2-a_2\},$$

and thus also quantitatively addresses the problem (a). On the other hand, in cyclic operation according to formulation 14 it is ensured that the respective actuator not deflecting the optical element, for example the second actuator during step (ii'), has enough "time" for its return. According to formulation 15, this "time" corresponds to at least $$\frac{1}{4}(b_1-a_1+b_2-a_2),$$

as is readily apparent.

Formulation 16. Projection exposure apparatus according to any of formulations 1 to 9, characterized in that
the manipulator comprises a sensor for determining a relative or absolute deflection of the optical element in the direction of the degree of freedom, and
the manipulator comprises a regulation device for processing signals of the sensor or signals of the sensor and of the control device.

In a projection exposure apparatus according to formulation 16, the real deflection of the optical element can be measured by the sensor. This real deflection can be adjusted with a deflection predefined by the control of the manipulator.

Formulation 17. Projection exposure apparatus according to formulation 16, characterized in that
the manipulator comprises an additional sensor for determining the relative or absolute velocity of the optical element in the direction of the degree of freedom,
or
the manipulator comprises a further additional sensor for determining the relative or absolute acceleration of the optical element in the direction of the degree of freedom, and
the signals of the additional sensor or of the additional sensor and of the further additional sensor are processable by the regulation device.

In a projection exposure apparatus according to formulation 17, the velocity and the acceleration of the deflection of the manipulator can also be calibrated.

Formulation 18. Method according to any of formulations 10 to 15 for moving an optical element of a projection exposure apparatus for microlithography according to formulation 16,
characterized by
predefinition of a desired deflection of the optical element in the direction of the degree of freedom,
deflection of the optical element according to any of formulations 10 to 15,
determination of the real deflection of the optical element by the sensor,
processing of the signals of the sensor or of the signals of the sensor and of the control by the regulation device,
correction of the control of at least one actuator by the regulation device in order to reduce the distance between the predefined deflection of the optical element and the real deflection of the optical element.

The method according to formulation 18 describes the adjustment between controlled and measured deflection of the optical element.

Formulation 19. Method according to formulation 18 for moving an optical element of a projection exposure apparatus for microlithography according to formulation 11 to formulation 15 and formulation 17,
characterized by
predefinition of a desired deflection, velocity and acceleration of the optical element in the direction of the degree of freedom,
deflection of the optical element according to any of formulations 11 to 15,
determination of the real deflection, velocity and acceleration of the optical element by the sensor, and respectively the further sensor, and respectively the additional further sensor,
processing of the signals of the sensors or of the signals of the sensors and of the controls by the regulation device,
correction of the control of at least one actuator by the regulation device in order to reduce the distance between the predefined deflection of the optical element and the real deflection and the predefined velocity of the optical element and the determined velocity and the predefined acceleration of the optical element and the determined acceleration.

The method according to formulation 19 describes the adjustment between controlled and measured deflection, velocity of the deflection and acceleration of the deflection of the optical element.

Formulation 20. Method for operating a projection exposure apparatus for microlithography according to formulation 12 and any of formulations 13 to 15 or according to formulation 12 and formulation 19, characterized by
predefinition of a desired position for the deflection of the optical element in the degree of freedom,
attainment of the desired position by carrying out the method steps according to formulation 12 and any of formulations 13 to 15 or formulation 12 and formulation 19, wherein
the deflection of the first and respectively second actuators in steps (ii), (iv), (vi), (viii) according to formulation 9 is effected by shearing of the first and respectively second shear piezos,
the change of the actuator responsible for the deflection of the optical element is effected by the stroke movement of the first and respectively second stroke piezos.

In a method according to formulation 20, the method according to formulation 9 is carried out with the actuators according to formulation 5. The shearings of the shear piezos move the optical element in the direction or counter to the direction of the degree of freedom. The stroke movements of the stroke piezos produce the connection between inner mount, holding the optical element, and outer mount. The optical element is deflected by the first and/or second actuator in accordance with the method steps according to formulation 9 precisely when the first and/or second stroke piezo produces the frictional engagement according to formulation 5.

Formulation 21. Projection exposure apparatus for microlithography comprising
an optical element,
a manipulator for deflecting the optical element in a degree of freedom, the manipulator comprising
a finite number n of actuators for deflecting the optical element in a direction of the degree of freedom and counter to the direction of the degree of freedom,
each of the actuators being controllable by a variable $\alpha_i$, i=1, ..., n from control ranges $[a_i, b_i]$, i=1, ..., n with maximum deflections of the optical element in the direction of the degree of freedom by the respective control with $b_i$, i=1, ..., n and minimum deflections in the direction of the degree of freedom by the respective control $a_i$, i=1, ..., n,
and a control device for controlling the actuators in their control ranges,
for all controls $\alpha_i$—performed by the control—from $[a_i, b_i]$, i=1, ..., n the following holds true:

$$\text{if } \left(1 - \frac{m}{n}\right)a_1 + \frac{m}{n}b_1 \leq \alpha_1 < \left(1 - \frac{m+1}{n}\right)a_1 + \frac{m+1}{n}b_1$$

for a natural number m where $1 \leq m < n$, then $$\left(1 - frac\left(\frac{m+i-1}{n}\right)\right)a_i + frac\left(\frac{m+i-1}{n}\right)b_i \leq$$
$$\alpha_{s(i)} < \left(1 - frac\left(\frac{m+i-1}{n}\right)\right)a_i + frac\left(\frac{m+i-1}{n}\right)b_i$$

for an arbitrarily chosen permutation s of the numbers $\{2, \ldots, n\}$.

In this case, frac is defined via the function entier, referred to as greatest integer or entier function: it holds true that frac(x)=x−entier(x) and entier(x) is the smallest integer less than or equal to x.

A projection exposure apparatus according to formulation 21 has, for deflecting the optical element, a number of n actuators whose control ranges $[a_i, b_i]$, i=1, ..., n are not interlaced in pairs in the sense of formulation 1, rather in which the entire control range is decomposed into n pieces that are equidistant as seen in relative terms, wherein each of the actuators is controlled in a subsegment of its control range that is predefined in accordance with the permutation s. What is thereby achieved is that for each predefined control of the actuators and for each spontaneously predefined, desired deflection it is possible to guarantee that—for even $$n - \frac{n}{2}$$

of the actuators have at least half of their control range available for deflecting the optical element. In this way, it is advantageously possible to react to spontaneously desired changes in direction for the deflection of the optical element, wherein at the same time much deflection can be made available via a plurality of actuators.

Instead of for a permutation on the entire set $\{2, \ldots, n\}$, the requirement according to formulation 21 can also be required just for a subset of $\{2, \ldots, n\}$.

Formulation 22. Projection exposure apparatus according to formulation 21, characterized in that
s is the identity mapping.

If the permutation s is the identity, then the function of the manipulator according to formulation 6 can be understood as a type of "wave movement" and generated in a simple manner.

Formulation 23. Projection exposure apparatus according to formulation 22, characterized in that
each of the actuators contains a shear piezo and a stroke piezo,
wherein the optical element is deflectable via frictional engagement between the shear piezos of a subset of the actuators and the inner mount and shearing of the shear piezos in the direction of the degree of freedom,
the frictional engagement can be effected by the stroke movement of the stroke piezos of the subset of actuators in a direction that is different from the direction of the degree of freedom.

A projection exposure apparatus according to formulation 23 is the analogue of a projection exposure apparatus according to formulation 5 in the embodiment for a finite number n of actuators.

Formulation 24. Method for moving an optical element of a projection exposure apparatus for microlithography according to either of formulations 21 and 22, characterized in that the following successive method steps are carried out:
production of a frictional engagement between the shear piezos of a subset T of the actuators and the inner mount by first stroke movements of the stroke piezos of the actuators of the subset,
synchronous shearing of the subset T of shear piezos in the direction of the degree of freedom and associated deflection of the optical element in the direction of the degree of freedom,
synchronous shearing of the shear piezos of the actuators which do not belong to the subset T of actuators counter to the direction of the degree of freedom,
ending of the two last-mentioned method steps if one of the shear piezos of the subset T of actuators has attained its maximum shearing in the direction of the degree of freedom, or if one of the shear piezos which does not belong to the subset T of actuators has attained its minimum shearing in the direction of the degree of freedom,
production of a frictional engagement between inner mount and the shear piezo of the actuator which does not belong to the subset T of actuators and whose shear piezo has the most minimum shearing in the direction of the degree of freedom as a result of a first stroke movement of the stroke piezo of the actuator,
release of the frictional engagement between inner mount and the shear piezo of the actuator which belongs to the subset T of actuators and whose shear piezo has the most maximum shearing in the direction of the degree of freedom as a result of a second stroke movement—opposite to the first stroke movement—of the stroke piezo of the actuator.

A method according to formulation 24 is the analogue of a method according to formulation 20 in the embodiment for a finite number n of actuators. There are in each case a finite set consisting of a constant number of shear piezos in frictional engagement with the inner ring. If one of the shear piezos attains its maximum control range, then it is replaced by another shear piezo. The more actuators there are in the subset T, the greater the range of a spontaneously possible deflection of the optical element without movement of a stroke piezo. The fewer actuators there are in the subset T, the more shear piezos move counter to the direction of the degree of freedom and the shorter in general the time which can be estimated therefor.

By way of example, if the permutation s according to formulation 21 is the identity and it holds true that $[a_1, b_1] = [a_i, b_i]$, i=2, ..., n, and that T consists only of a single actuator, then the latter is preferably controlled in such a way that it attains its minimum deflection in the time where none of the other actuators attains its maximum deflection. According to formulation 21, the actuators are offset "temporally" by $$\frac{1}{n},$$

such that the actuator from T has available only "time"

$$\frac{1}{n}$$

to attain its control $a_1$, since after this time the actuator "succeeding" by $$\frac{1}{n}$$

attains its maximum control range. Therefore, in the case of a one-element subset T the returning actuator is driven with an n-fold velocity compared with the deflecting manipulators. By contrast, if T consists of two actuators offset "temporally" by $$\frac{1}{n},$$

then the actuators have the "time"

$$\frac{2}{n}$$

for their "return".

Formulation 25. Method according to formulation 24, characterized in that
the method is carried out cyclically.

A method according to formulation 25 is the analogue of a method according to formulation 14 in the embodiment for a finite number n of actuators.

Formulation 26. Method according to formulation 24, characterized in that
the number of actuators which belong to the subset is varied.

Through the variation of the subset T it is possible to vary the range of a spontaneously possible deflection of the optical element without movement of a stroke piezo and the return time for the actuators not belonging to the subset T.

Formulation 27. Method for calibrating the actuators of a manipulator of a projection exposure apparatus according to any of formulations 1 to 9, or any of formulations 16 to 18, characterized in that
for the actuators which the manipulator comprises, there are determined the deflections and/or velocities and/or accelerations of the optical element depending on the controls from the control ranges $[a_i, b_i]$ and/or $[a_i^v, b_i^v]$ and/or $[a_i^a, b_i^a]$ and/or $[c_i, d_i]$ and/or $[c_i^v, d_i^v]$ and/or $[c_i^a, d_i^a]$,
the controls of the actuators in the control ranges $[a_i, b_i]$ and/or $[a_i^v, b_i^v]$ and/or $[a_i^a, b_i^a]$ are adapted such that the deflection and/or velocity and/or acceleration of the optical element is not altered during the change of the deflection of the optical element by the first to the second actuator, and
the controls of the actuators in the control ranges $[c_i, d_i]$ and/or $[c_i^v, d_i^v]$ and/or $[c_i^a, d_i^a]$ are adapted so as not to induce any deflection and/or velocity and/or acceleration of the optical element during the change from the production or release of the frictional engagement by the stroke piezos of the first actuator to the production or release of the frictional engagement by the stroke piezos of the second actuator orthogonally with respect to the degree of freedom.

As a result of a calibration according to formulation 27, no impulses or forces are input into the optical element if the manipulator deflecting the optical element changes, or the stroke piezo producing the frictional engagement between inner ring and outer mount changes.

Formulation 28. Method according to formulation 27 and any of formulations 6 to 9, characterized in that
the deflections of the optical element are determined by those of the shearings of the shear piezos.

In the method according to formulation 28, the deflection of the optical element is measured directly via the shearing of shear piezos. The controls in the control ranges $[a_1, b_1]$ and/or $[a_2, b_2]$ can then be adjusted directly via voltage differences.

Formulation 29. Method for calibrating a manipulator of a projection exposure apparatus according to formulation 28 or formulation 27,
characterized in that
the magnitudes of the shearings are measured by an interferometer.

Via the interferometric measurement according to formulation 29, the magnitude of the shearing can be determined very precisely and can be compared with the voltage difference according to formulation 28, as a result of which manufacturing fluctuations of the shear piezos can be ascertained and calibrated.

Formulation 30. Projection exposure apparatus according to any of formulations 1 to 10, or according to any of formulations 16 to 18,
characterized in that
the manipulator contains a second memory for holding one or more control margins.

The second memory for holding control margins according to formulation 30 serves for holding parameters which predict the erroneous deflection of the optical element if a change is made from a first to a second control mode of the actuators.

Formulation 31. Method according to formulation 12 or according to formulation 12 and either of formulations 14 and 15 for moving an optical element of a projection exposure apparatus for microlithography according to formulation 30, characterized by
shearing of the first shear piezo by increasing the voltage from $[a_1, b_1]$ under the control of the shear piezo of the first actuator as charge control,
determination of a voltage margin $\alpha'$ as control margin from the hysteresis curve of the first shear piezo, such that upon shearing of the first shear piezo with the voltage $\alpha'+b_1-\alpha$ and changeover of the control of the first actuator from the charge control to a voltage control a real deflection of the optical element would be obtained which would correspond to a nominal deflection upon a shearing of the first shear piezo with the voltage $b_1-\alpha$ under the control of the shear piezo of the first actuator as charge control,
determination of a voltage margin $\beta'$ as control margin from the hysteresis curve of the second shear piezo, such that upon shearing of the second shear piezo with the voltage $\beta'+b_1-\alpha$ and changeover of the control of the second actuator from the charge control to a voltage control a real deflection of the optical element would be obtained which would correspond to a nominal deflection upon a shearing of the second shear piezo with the voltage $a_2+\alpha$ under the control of the shear piezo of the second actuator as charge control,
shearing of the first shear piezo with the voltage $\alpha'+b_1-\alpha$ and shearing of the second shear piezo with the voltage $\beta'+a_2+\alpha$, instead of the shearing of the first shear piezo with the voltage $b_1-\alpha$ and shearing of the second shear piezo with the voltage $a_2+\alpha$.

The method according to formulation 31 uses the second memory for holding two voltage margins which compensate for the jump in the control, the jump being caused by the hysteresis curves of the shear piezos, if they change from charge control to voltage control. This prevents a jump or an error in the deflection of the optical element if a change between the two controls occurs.

Formulation 32. Method according to formulation 19 for moving an optical element of a projection exposure apparatus for microlithography according to formulation 12 and formulation 16,
characterized in that
there is performed a determination of the relative or absolute deflection of the optical element in the direction of the degree of freedom by the sensor according to formulation 16 after the release of the frictional engagement between first shear piezo and inner mount by a second stroke movement of the first stroke piezo, the second stroke movement being opposite to the first stroke movement of the first stroke piezo, according to formulation 12.

Via a method according to formulation 32, the deflection of the optical element is determined anew if the frictional engagement is released. In such a case, on account of the loading on the shear piezo being relieved, an undesired movement of the optical element occurs, which can be compensated for after the determination of the relative or absolute deflection of the optical element by a deflection of the optical element.

Formulation 32. Projection exposure apparatus according to any of formulations 7 to 9 or according to formulation 9 and any of formulations 16 to 18,
characterized in that
    the first shear piezo is connected to the first stroke piezo via the outer mount,
    the second shear piezo is connected to the second stroke piezo via the outer mount.

If the shear piezos are connected to the stroke piezos via the outer mount according to formulation 32, then a stiff guidance of the inner ring is achieved, which leads to a small tilting of the inner ring or a guidance according to U.S. Pat. No. 7,173,363. This in turn allows a high directional stability of the deflection of the optical element in the degree of freedom.

Here and hereinafter, the stiffness of a guidance should be taken to mean the resistance of the guidance relative to a force orthogonal to the direction of the guidance.

Formulation 33. Projection exposure apparatus according to any of formulations 1 to 9 or according to any of formulations 16 to 18, or according to either of formulations 21 and 22, or according to formulation 29, or according to formulation 32,
characterized in that
the manipulator has a guide mechanism for guiding the deflection of the optical element in a direction of the degree of freedom.

As a result of the guide mechanism according to formulation 33, a stiff guidance of the inner ring is achieved, which leads to a small tilting of the inner ring or a guidance according to U.S. Pat. No. 7,173,363. This in turn allows a high directional stability of the deflection of the optical element in the degree of freedom.

Formulation 34. Projection exposure apparatus according to any of formulations 6 to 9, or formulation 22, or any of formulations 6 to 9 in conjunction with any of formulations 16 to 18, or formulation 29 or either of formulations 32 and 33,
characterized in that
    the manipulator comprises a common first control line from the control to the first shear piezo of the first actuator and to the second shear piezo of the second actuator,
    or
    the manipulator comprises a common first control line from the control to the first shear piezo of the first actuator and to the second shear piezo of the second actuator and the manipulator comprises a common second control line from the control to the first stroke piezo of the first actuator and to the second stroke piezo of the second actuator, and
    the first shear piezo has a direction of polarization opposite to that of the second shear piezo, or
    the first shear piezo has a direction of polarization opposite to that of the second shear piezo and the first stroke piezo has a direction of polarization opposite to that of the second stroke piezo.

As a result of the common control lines according to formulation 34, the cabling outlay of the control is reduced and calibrations of the control signals are limited to a minimum.

Formulation 35. Projection exposure apparatus according to any of formulations 6 to 9, or formulation 22, or any of formulations 6 to 9 in conjunction with any of formulations 16 to 18, or formulation 29 or any of formulations 32 to 34,
characterized in that
    the deflection of the shear piezos and/or stroke piezos is measured via the voltage present at it or at them, or
    the deflection of the shear piezos and/or stroke piezos is measured via the voltage present at it or at them and the velocity of the deflection of the shear piezos and/or stroke piezos is measured via the voltage profile or current profile present at it or at them,
    or
    the deflection of the shear piezos and/or stroke piezos is measured via the voltage present at it or at them and the velocity of the deflection of the shear piezos and/or stroke piezos is measured via the voltage profile or current profile present at it or at them and the acceleration of the deflection of the shear piezos and/or stroke piezos is measured via the voltage profile or current profile present at it or at them.

Via the measurement of the deflections, of the velocity of the deflections and of the accelerations of the deflections via voltage and/or current measurements directly via the voltages and/or voltage and/or current profiles present at the piezos, the deflection and/or velocity of the deflection and/or acceleration of the deflection are/is not deduced by the predefinition of the control signals, rather the control signals are additionally measured, such that discrepancies between the intended control and the real control can be identified.

Formulation 36. Projection exposure apparatus according to formulation 34 and formulation 35,
characterized in that
    the manipulator contains control lines,
    the control lines are in each case subdivided into a longer and a shorter part,
    one or a plurality of amplifying circuits for amplifying the voltages and/or currents present at the piezos are/is provided on the respective shorter parts of the control lines,
    the measurements of the voltages and/or currents at the piezos are provided by voltage and/or current feedback of the signals of the amplifying circuit.

Via an arrangement according to formulation 36, it is possible to measure the voltage and/or current profile at the piezos, without the control signals being altered or an electrical resonant circuit influencing the control signals as a result.

Further advantages and features are evident from the following description and the accompanying drawing.

It goes without saying that the features mentioned above and those yet to be explained below can be used not only in the combination respectively indicated, but also in other combinations or by themselves, without departing from the scope of the present invention.

Exemplary embodiments of the invention are illustrated in the drawing and are described in greater detail below with reference to the drawing, in which.

Figure 1:
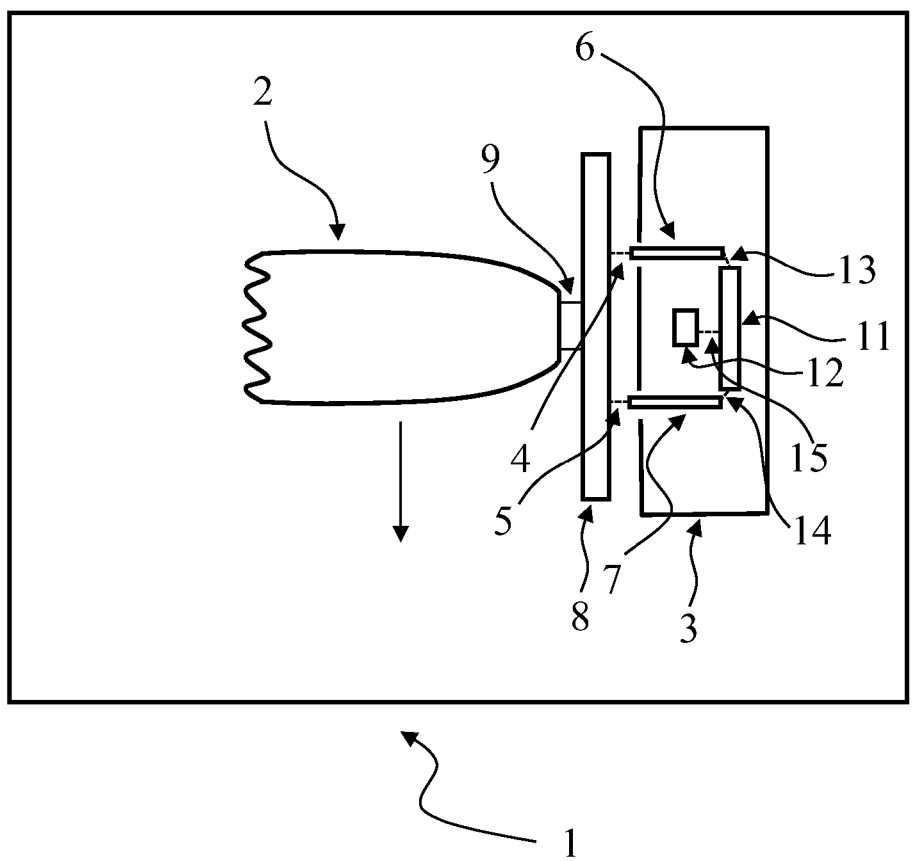
FIG. 1 shows a projection exposure apparatus for microlithography comprising the arrangement according to the invention of optical element, manipulator and two actuators.

FIG. 1 shows a detail 1 from a projection exposure apparatus for microlithography. The projection exposure apparatus contains an optical element 2, in the case illustrated here a lens element 2 and a manipulator 3, which contains two actuators 4, 5. The actuators 4, 5 act 6, 7 on a guide 8, which is connected to the optical element 2 by a mount 9 holding the optical element 2.

The actuators 4, 5 deflect the optical element in a direction of a degree of freedom 10 or counter to the direction. The actuators 4, 5 are controlled by control ranges (not illustrated here) in accordance with formulation 1 and the conditions formulated therein.

Figure 2:
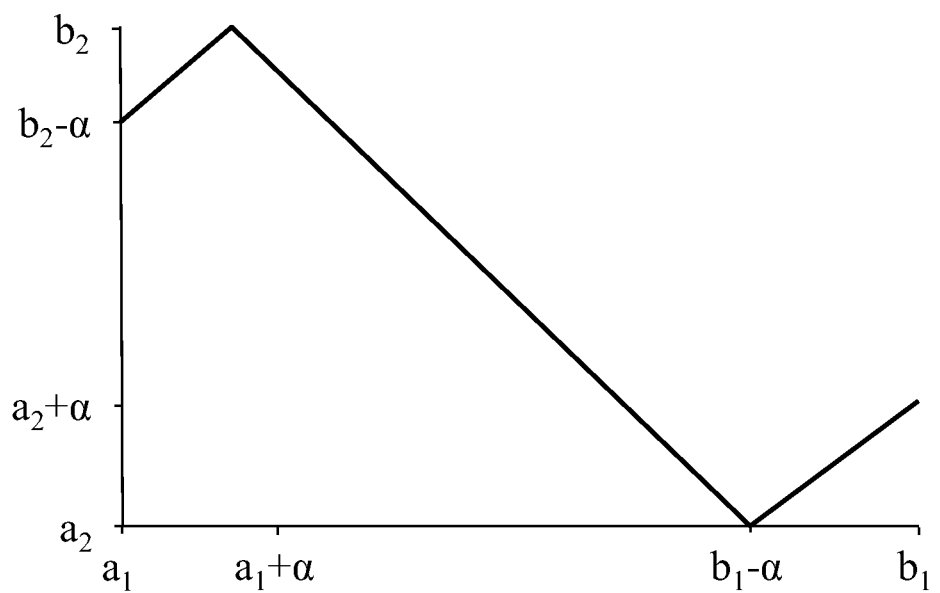
FIG. 2 illustrates the control of two actuators.

The manipulator 3 furthermore comprises a control device 11, which controls 13, 14 the actuators 4, 5. The convolution parameter α from formulation 1 is stored in the memory 12 and can be read out and varied 15 by the control 11. FIG. 2 illustrates the controlling of the first actuator or of the second actuator of a projection exposure apparatus according to formulation 3. The control interval $[a_1, b_1]$ of the first actuator is plotted on the abscissa. The control interval $[a_2, b_2]$ of the second actuator is plotted on the ordinate. The two control intervals are divided into three parts in each case with a convolution parameter α in accordance with formulation 1. The graph shown illustrates conditions E, F, G from formulation 3. In the case of a rising, linear deflection of the first actuator in the control range $\alpha_1 < a_1 + \alpha$, the second actuator is deflected in its control range in a linearly rising manner from the value $b_2 - \alpha$ to $b_2$. A subsequent, further linearly rising deflection of the first actuator from the value $a_1 + \alpha$ to the value $b_2 - \alpha$ requires, according to formulation 3, a return of the second actuator from the value $b_2$ to the value $a_2$. This is a linearly falling deflection. A final control of the first actuator from the value $b_1 - \alpha$ linearly to the value $b_1$ requires, according to formulation 3, a linear deflection of the second actuator from the value $a_2$ to the value $a_2 + \alpha$.

In accordance with formulation 1, the optical element is deflected jointly by both actuators in the control ranges $[a_1, a_1 + \alpha)$ and $(b_1 - \alpha, b_1]$. In the control interval $[a_1 + \alpha, b_1 - \alpha]$, the optical element is deflected only by the first actuator.

If the method is carried out cyclically in the manner according to formulation 3, then the roles of the first actuator and the second actuator are interchanged. For the illustration according to FIG. 2, this means that it is merely necessary to interchange the indexes 1 and 2.

Figure 3:
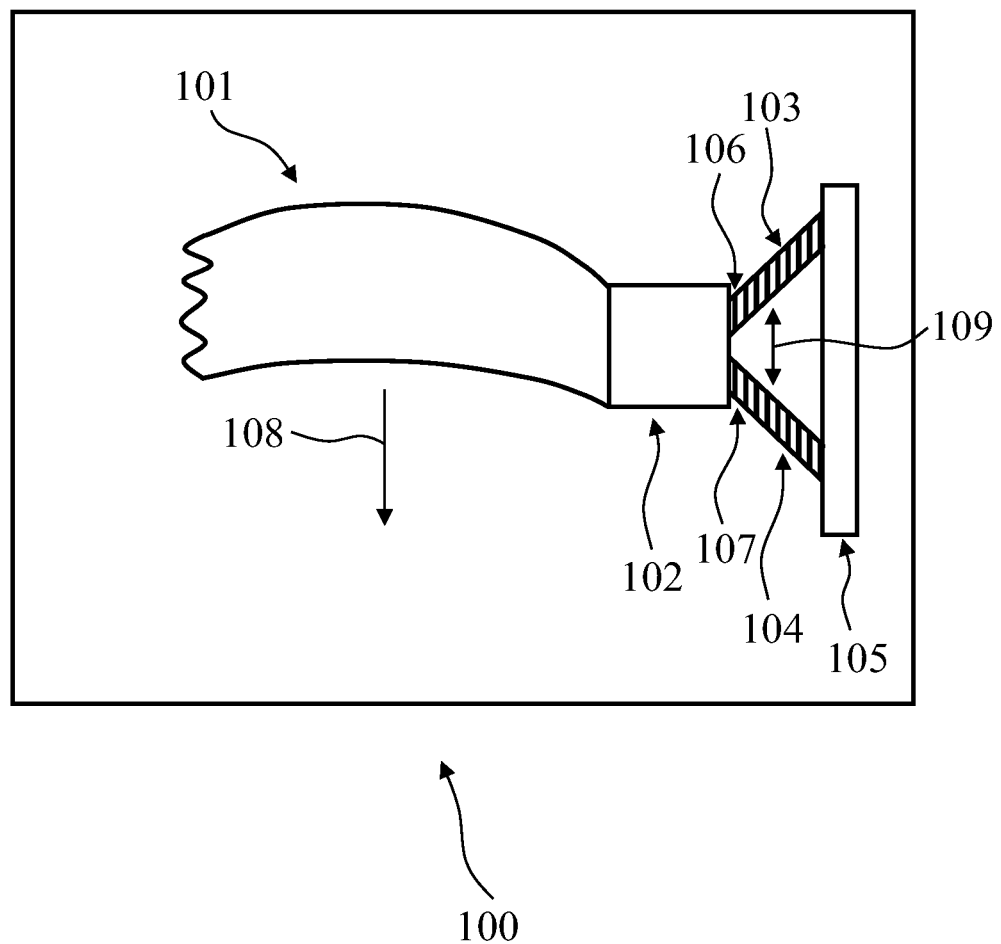
FIG. 3 shows a projection exposure apparatus comprising shear piezos which produce a connection between an inner and an outer mount.

FIG. 3 shows a detail 100 from a projection exposure apparatus according to formulation 5 comprising an optical element 101, an inner mount 102, a first actuator (not illustrated here), which contains a first shear piezo 103, a second actuator (not illustrated here), which contains a second shear piezo 104, and an outer mount 105. The outer mount 105 is connected to the shear piezos 103, 104. The inner mount 102 is connected to the first shear piezo 103 via a frictional engagement 106. Furthermore, the inner mount 102 is connected to the second shear piezo 104 via a frictional engagement 107. The inner mount 102 holds the optical element 101. If the shear piezos 103, 104 are deflected in one of their shear directions 109, one of which corresponds to the direction of the degree of freedom 108, then the optical element 101 is also deflected in this direction.

Figure 4:
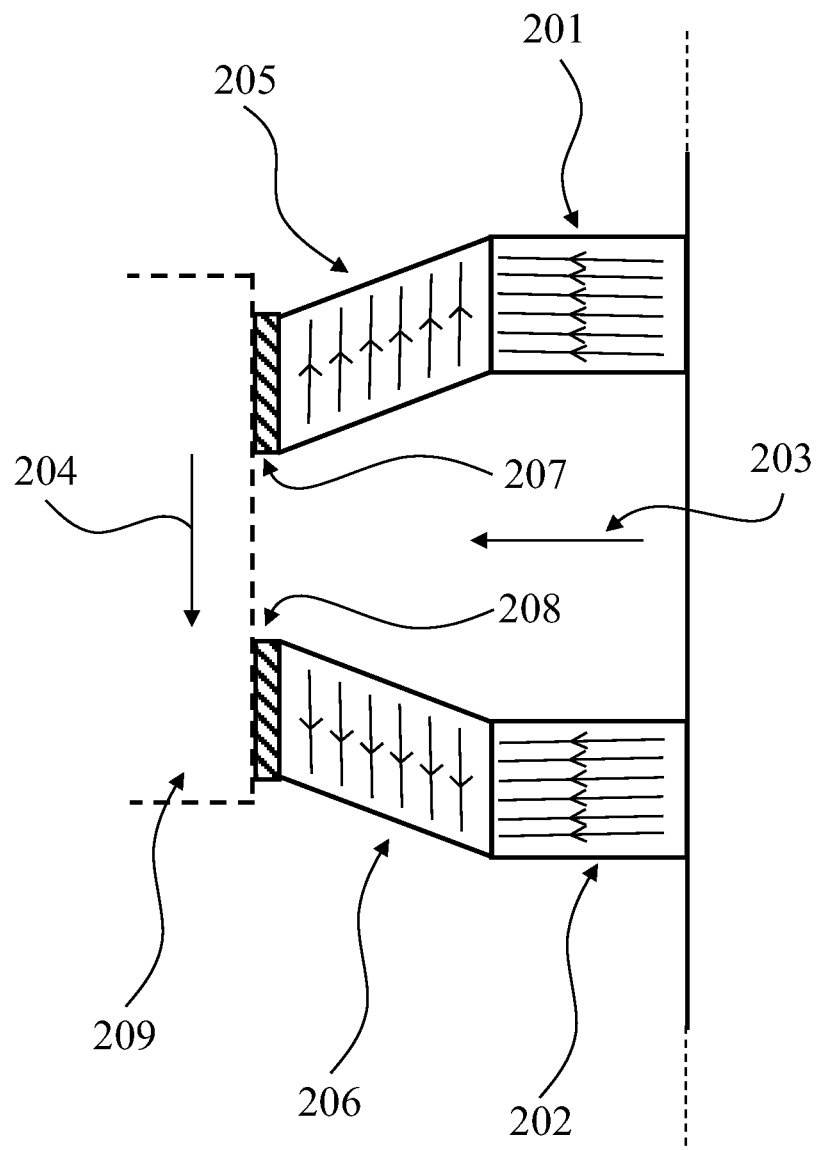
FIG. 4 shows actuators containing shear and stroke piezos.

FIG. 4 shows an excerpt from the first actuator (not illustrated here), which contains a first stroke piezo 201 and which contains a second stroke piezo 202. The stroke piezos can perform a stroke movement in a direction 203 which is orthogonal to the direction of the degree of freedom 204 and which is thus also orthogonal to the shear direction of the shear piezos 205 and 206. The stroke movement of the stroke piezos 201, 202 in direction 203 produces a frictional engagement 207, 208 between the shear piezos 205, 206 and the inner mount 209.

Figure 5:
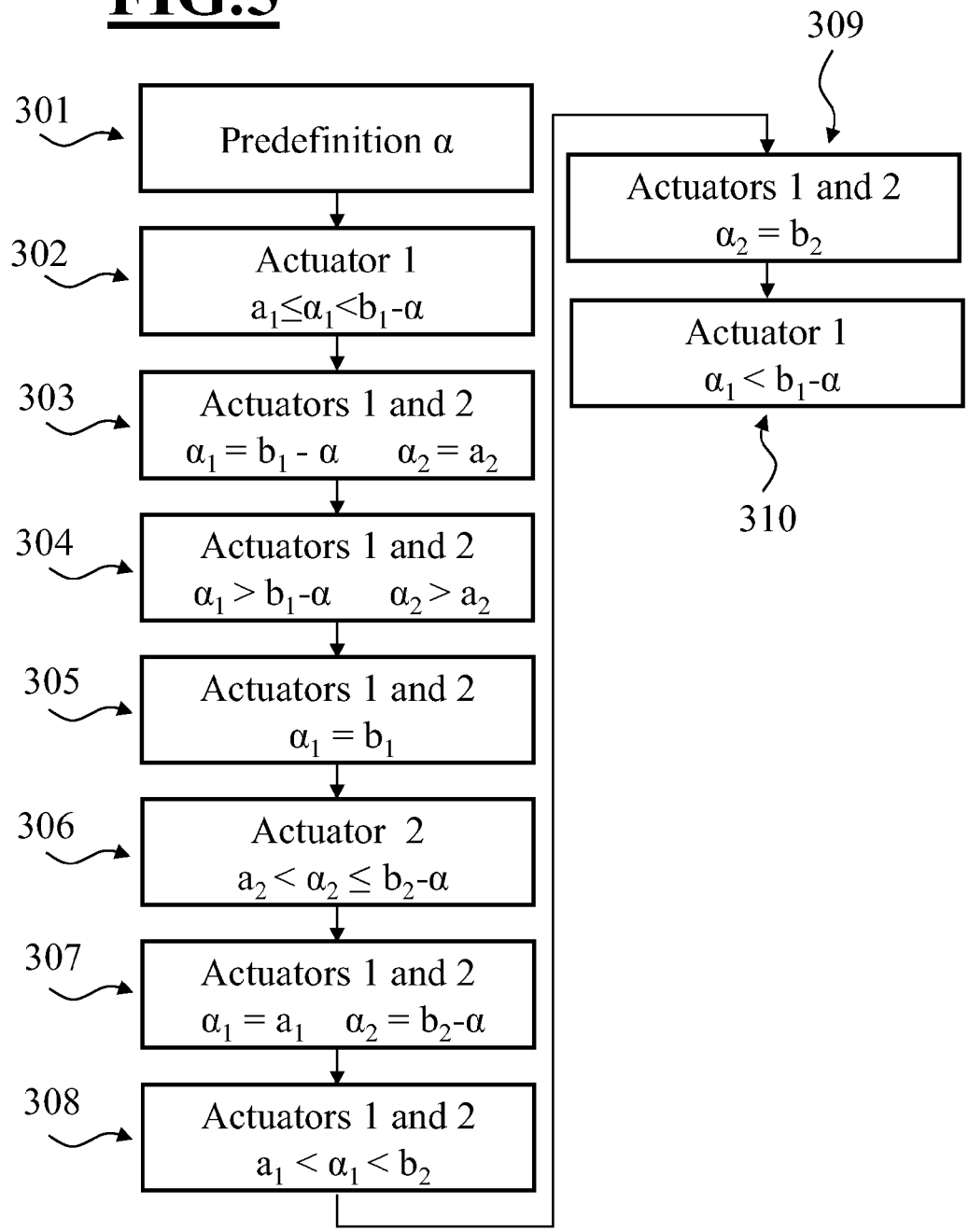
FIG. 5 shows the flowchart of a method for moving an optical element.

FIG. 5 shows the flowchart of a method according to formulation 15. In a first step 301, the convolution parameter α is predefined. In a second step 302, the optical element is deflected solely by the first actuator in its control range from $a_1$ to $b_1 - \alpha$. In a third step 303, the first actuator is controlled with the value $b_1 - \alpha$ and the second actuator is controlled with the value $a_2$. In a fourth step 304, the optical element is deflected via the first and second actuators in the direction of the degree of freedom, wherein the first actuator is controlled in a range greater than $b_1 - \alpha$ and the second actuator is controlled in a range greater than $a_2$. In a fifth step 305, the first actuator is controlled with the value $b_1$. In the next step 306, the optical element is controlled solely by the second actuator in the range $\alpha_2$ to $b_2 - \alpha$. In the next step 307, the first actuator is controlled with $a_1$ and the second actuator is controlled with $b_2 - \alpha$. In the next step 308, the optical element is deflected by the first actuator together with the second actuator, wherein $\alpha_1$ rises from the value $a_1$ and moves toward the value $b_2$. In a next step 309, the second variable $\alpha_2$ is controlled with $b_2$. In a next step 310, the optical element is deflected solely by the first actuator, wherein the first variable $a_1$ moves toward the value $b_1 - \alpha$.

Since step 310 and step 302 correspond to one another, the method according to FIG. 5 can be carried out cyclically. In this case, the convolution parameter α can be set anew in each cycle.

Figure 6:
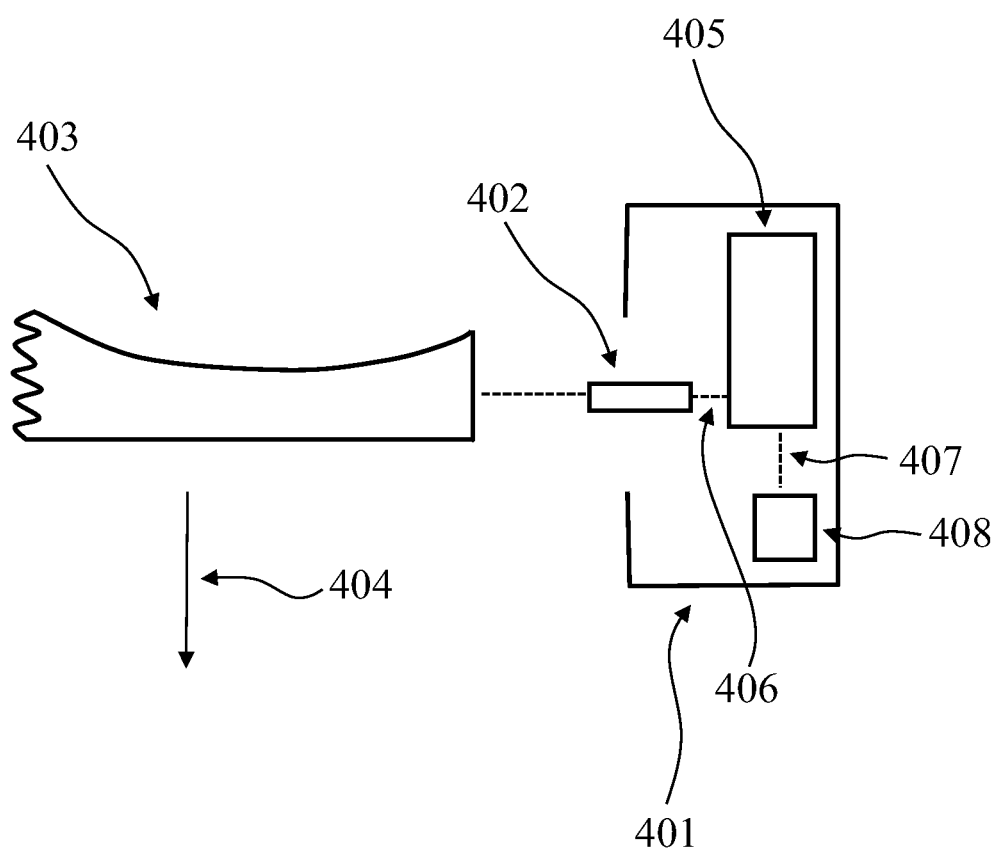
FIG. 6 shows an arrangement of sensor, manipulator and regulation device.

FIG. 6 shows a manipulator 401 according to formulation 16, comprising a sensor 402, which determines in relative or absolute terms the deflection of the optical element 403, which is designed as mirror 403 in FIG. 6, with regard to its deflection in the direction of the degree of freedom 404. Furthermore, the manipulator comprises a regulation device 405 for processing signals 406 of the sensor 402 and signals 407 of the control device 408.

Figure 7:
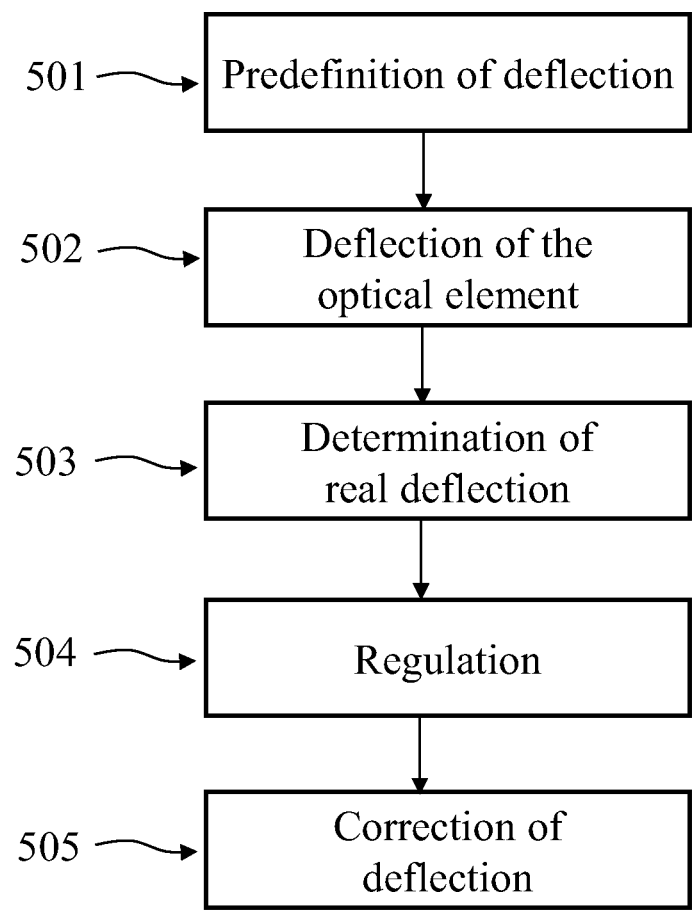
FIG. 7 shows a flowchart for a method for moving an optical element.

FIG. 7 shows the flowchart of the method according to formulation 18. In a first step 501, a desired deflection of the optical element in the direction of the degree of freedom is predefined. In a second step 502, the optical element is deflected according to one of formulations 10-15. In a third step 503, the real deflection of the optical element is determined by the sensor. In a fourth step 504, the signals of the sensor or the signals of the sensor and of the control are processed by the regulation device. In a fifth step 505, the control of at least one actuator which is currently deflecting the optical element is corrected on the basis of the difference between desired and real deflection as determined by the regulation.

Figure 8:
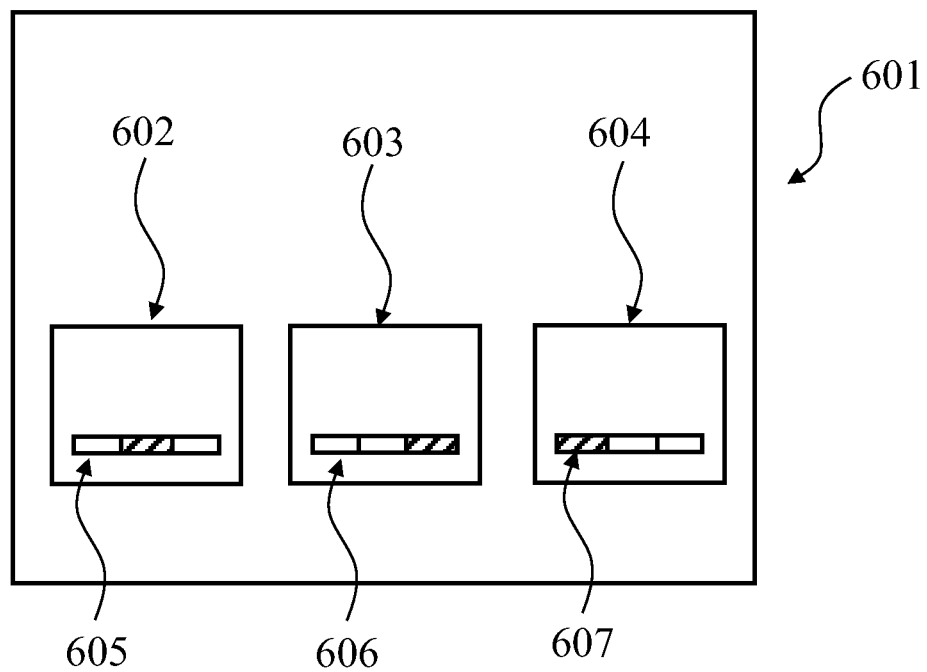
FIG. 8 shows a manipulator having three actuators for deflecting an optical element.

FIG. 8 shows a manipulator 601 for deflecting an optical element according to formulation 21. The manipulator comprises three actuators 602, 603, 604 with control ranges 605, 606, 607. The control ranges 605, 606, 607 are subdivided into three subranges in each case. The hatched parts of the control ranges illustrate the subranges from which controls are performed according to formulation 22.

Figure 9:
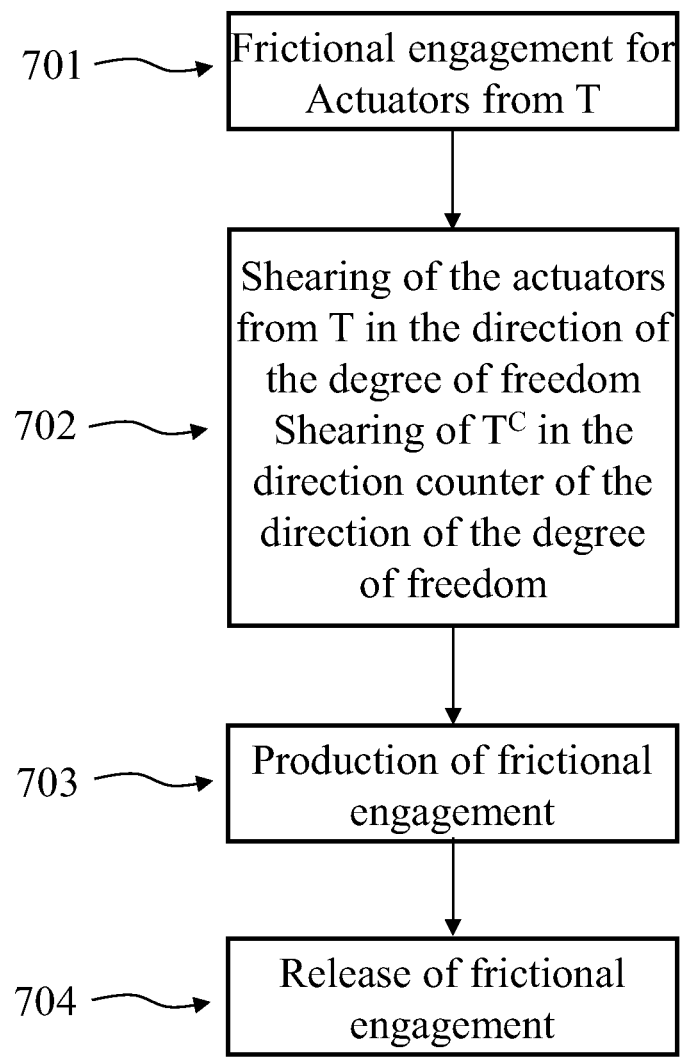
FIG. 9 shows a method sequence for moving an optical element.

FIG. 9 illustrates the method sequence of the method according to formulation 24. A first step 701 involves producing, for a subset T of the n actuators according to formulation 21, a frictional engagement between the shear piezos of the actuators and the inner mount via stroke movements of the stroke piezos of the actuators. In a next step 702, the shear piezos of the actuators from T shear in the direction of the degree of freedom, as a result of which the optical element is likewise deflected in this direction. In parallel, the shear piezos of the actuators which do not belong to the subset T, and which accordingly belong to the complement $T^c$ thereof, shear in the direction counter to the direction of the degree of freedom. A further step 703 involves producing a frictional engagement between inner mount and the shear piezo of the actuators from $T^c$ whose shear piezo has the most minimum shearing in the direction of the degree of freedom. A further step 704 involves releasing the frictional engagement between inner mount and the shear piezo of the actuator which belongs to the subset T of actuators and whose shear piezo has the most maximum shearing in the direction of the degree of freedom. In a variant which is not illustrated here, in the case where the most minimum shearing from step 703 coincides temporally with the most maximum shearing from step 704, steps 703 and 704 can be carried out in parallel.

Figure 10:
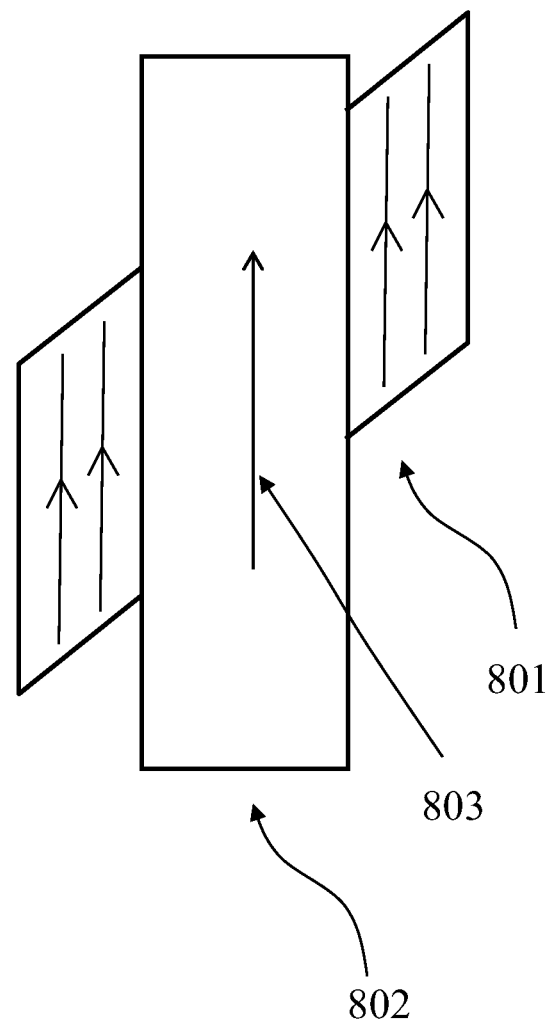
FIG. 10 shows a measurement of a deflection of an optical element by an interferometer.

FIG. 10 shows the arrangement comprising a shear piezo 801 and an interferometer 802, which measures the deflection of the shear piezo in its shear direction 803 interferometrically in absolute or relative terms. In an alternative embodiment, the interferometer 802 can be replaced by an encoder (not illustrated here).

Figure 11:
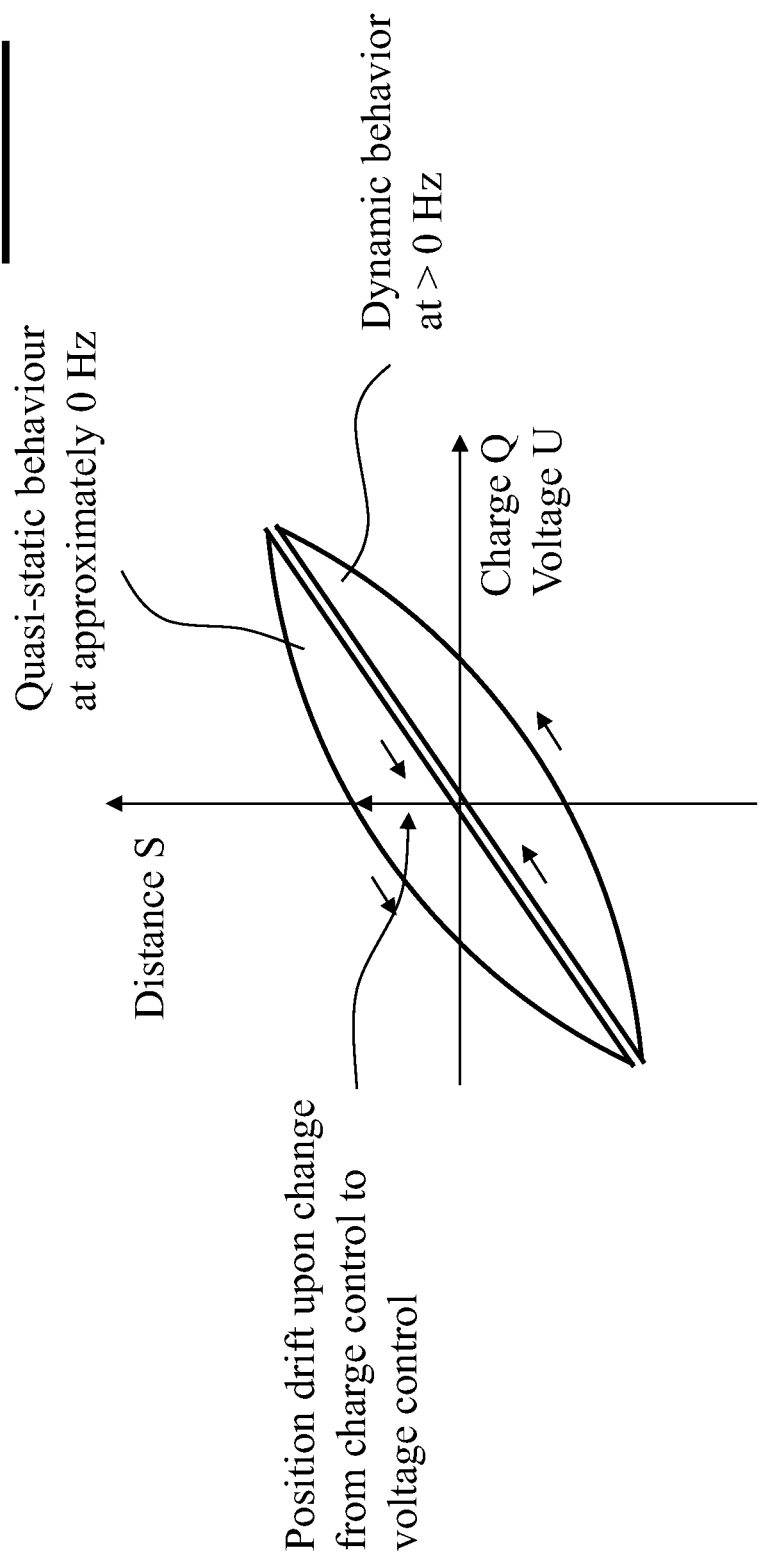
FIG. 11 illustrates the hysteresis curve which holds true for a changeover of a control of an actuator from a voltage control to a charge control.

FIG. 11 illustrates the hysteresis curve which applies to a changeover of a control of an actuator from a voltage control to a charge control. The dynamic behavior at >0 Hz corresponds to a charge control, alternatively called current control. Current and charge Q are linearly dependent on the distance S deflected by the shear piezos. Current or charge control is free of hysteresis. If the deflection of the manipulator and thus the shearing of a shear piezo attains its full-scale deflection, then a transition from the dynamic behavior >0 Hz to a quasi-static behavior ≈0 Hz takes place on the basis of control engineering. The hysteresis, and thus the non-linear behavior, to which the quasi-static voltage control with voltages U is subject can be made available in the form of a look-up table. The position drift if a change is made from a charge control to a voltage control—or vice versa—on the basis of control engineering is taken into account by a margin according to the formulation 31.

Figure 12:
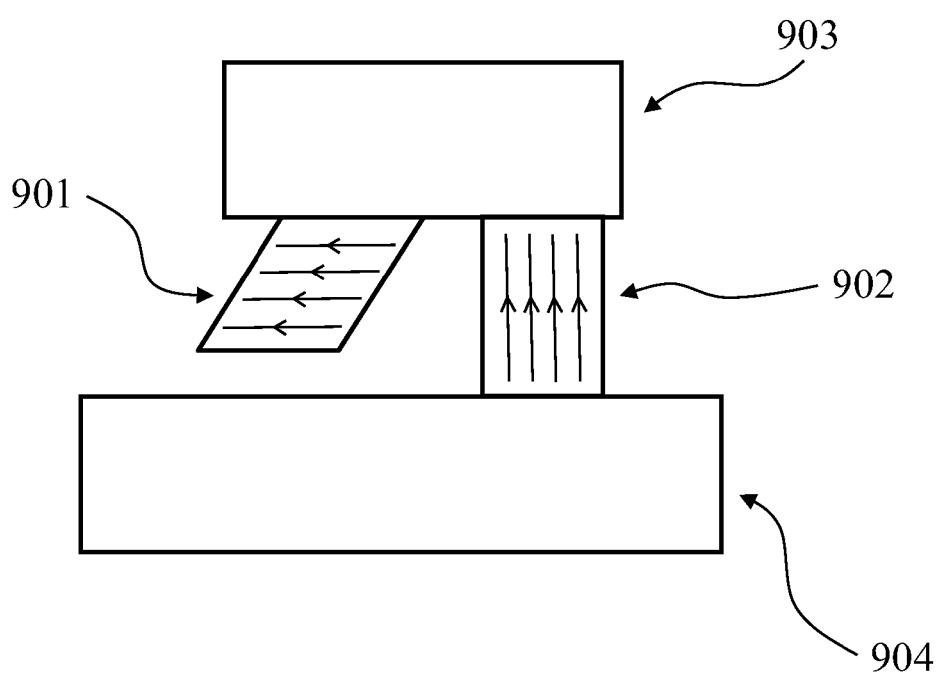
FIG. 12 shows a parallel arrangement of shear piezo and stroke piezo.

FIG. 12 shows an arrangement according to formulation 32 in which a shear piezo 901 is connected to a stroke piezo 902 via the outer mount 903. The inner ring 904 is not in frictional contact with the shear piezo 901 at the point in time of the illustration according to FIG. 12. This type of parallel arrangement of shear piezo and stroke piezo achieves a stiff guidance of the inner ring 904, which leads to little tilting of the inner ring 904 or a guidance according to U.S. Pat. No. 7,173,363. This in turn allows a high directional stability of the deflection of the optical element in the degree of freedom.

A further embodiment of the invention is not illustrated here, in which the stroke piezos are operated with a bias voltage. This should be understood to mean that the stroke piezos are designed such that, in the case where no control signal is present at the stroke piezos, a frictional contact between inner ring 904 and shear piezos 901 is present. This ensures that in the event of a failure of the control, and the associated voltage drop at the stroke piezos, the manipulator does not alter its deflection, and the optical element thus does not alter its position.

Figure 13:
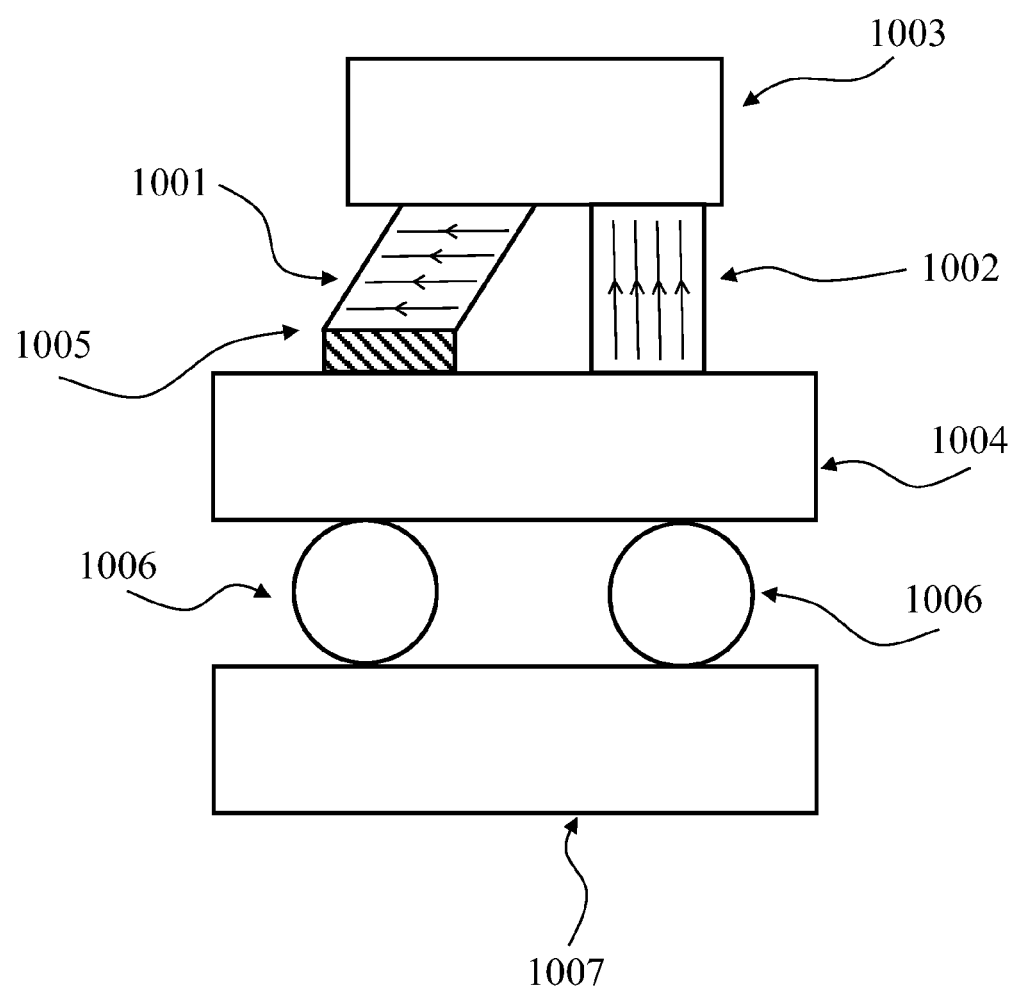
FIG. 13 shows a guided mounting of an inner ring.

FIG. 13 shows an arrangement according to formulation 33 in which a shear piezo 1001 is connected to a stroke piezo 1002 via the outer mount 1003. The inner ring 1004 is in frictional contact 1005 with the shear piezo 1001 at the point in time of the illustration according to FIG. 13. According to formulation 33, the manipulator has a guide mechanism for guiding the deflection of the optical element (not illustrated here) in a direction of the degree of freedom. In FIG. 13, the guide mechanism consist of a counterbearing 1007 guided by rollers 1006, the counterbearing further stiffening the directional stability of the deflection.

Figure 14:
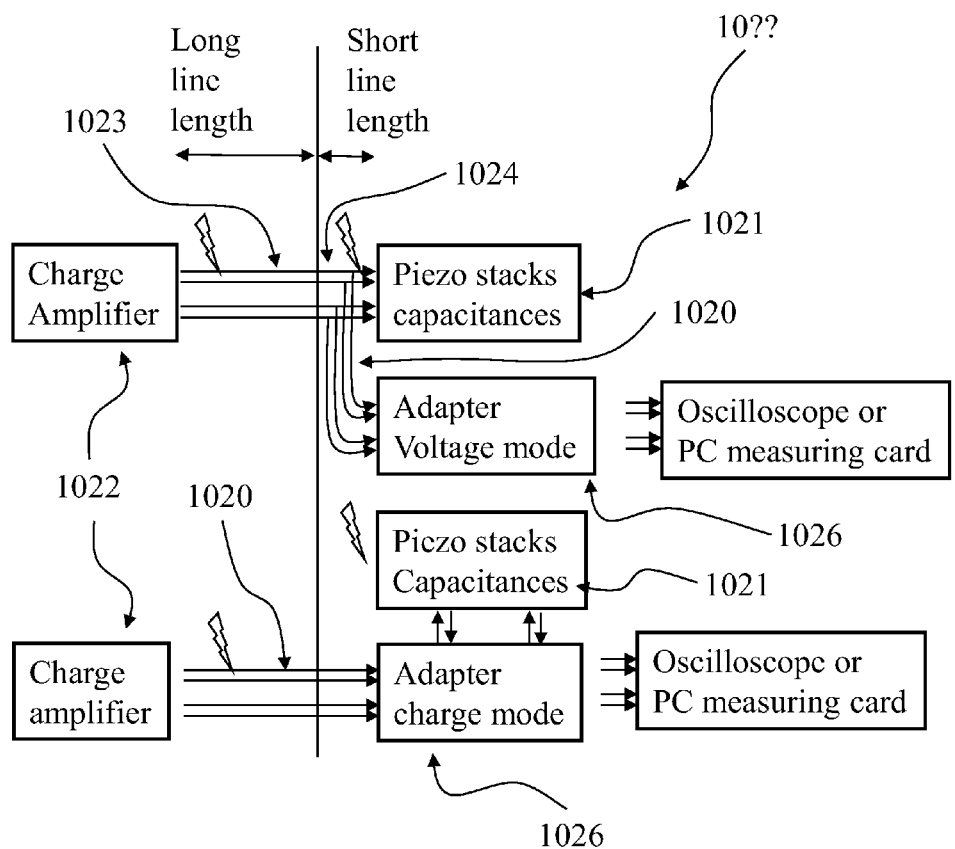
FIG. 14 shows a measuring principle for the measurement of a capacitance of a piezo.

FIG. 14 shows a measuring principle for the measurement of the voltage present at a piezo 1021. The basic problem of such a measurement is that a measuring voltage tap at a piezo leads to an electrical resonant circuit. The latter firstly corrupts the measurement result of the voltage present at the piezo. Secondly, the piezo, and thus also the actuator, is corrupted in terms of its deflection by a parasitic voltage caused by the measuring process. According to formulation 36, the control lines leading from the control, represented as charge amplifier 1022 in FIG. 14, to the piezos are subdivided into a longer 1023 and a shorter 1024 part. Capacitances which form as a result of electrical properties per unit length of the control lines are minimized as a result. An amplifying circuit 1026 for amplifying the voltage present at the piezo 1021 is provided at the respective shorter parts 1023 of the control lines. The measurement of the voltage at the piezo 1021 is performed by voltage feedback of the signals of the adapter circuit 1026.

The measured value amplified by the adapter circuit 1026 is beset by residual errors and can alternatively additionally be calibrated by adjustment with a model.

Figure 15:
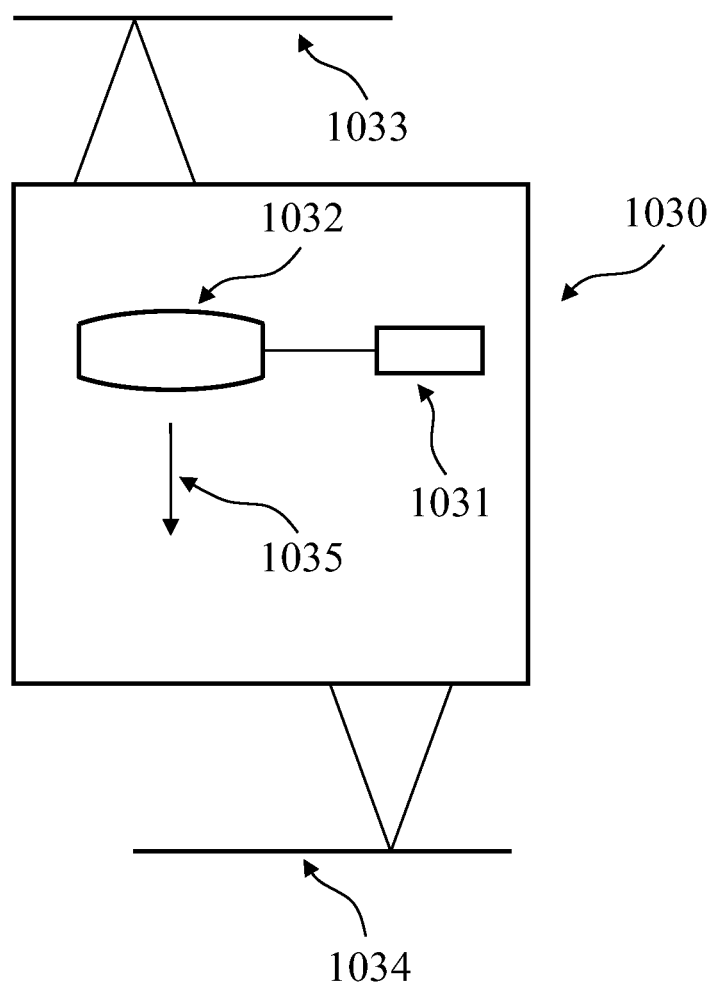
FIG. 15 shows a projection exposure apparatus for microlithography.

FIG. 15 shows a projection exposure apparatus for microlithography 1030 for imaging an object field 1033 onto an image field 1034. The projection exposure apparatus contains a manipulator 1031 according to the invention for deflecting an optical element 1032 in the direction of a degree of freedom 1035 in order to correct an image aberration such as, for example, the image field curvature or the scale error.

The invention claimed is:

1. An apparatus, comprising:
   an optical element;
   a manipulator configured to deflect the optical element in a degree of freedom, the manipulator comprising first and second actuators; and
   a control device configured to control the first and second actuators,
   wherein:
      the apparatus is a microlithography projection exposure apparatus;
      the first and second actuators are configured to deflect the optical element in a direction of the degree of freedom and in a direction counter to the direction of the degree of freedom;
      the first actuator is controllable by a first variable $\alpha_1$ from a first control range $[a_1, b_1]$ with a minimum deflection of the optical element in the direction of the degree of freedom by the control in direction $a_1$ and with a maximum deflection of the optical element in the direction of the degree of freedom by the control in direction $b_1$;
      the second actuator is controllable by a second variable $a_2$ from a second control range $[a_2, b_2]$ with a minimum deflection of the optical element in the direction of the degree of freedom by the control in direction $a_2$ and with a maximum deflection of the optical element in the direction of the degree of freedom by the control in direction $b_2$;

the control device is configured to control the first and second actuators in the control ranges $[a_1, b_1]$ and $[a_2, b_2]$, respectively;

the manipulator comprises memory configured to hold a convolution parameter $\alpha$ where $$0 < \alpha < \frac{1}{2}\min\{b_1 - a_1, b_2 - a_2\};$$

and for all controls performed by the control device to control the optical element in the degree of freedom, the following conditions A to D hold true:
A) If $\alpha_1 < a_1 + \alpha$ then $\alpha_2 > b_2 - \alpha$ and the first and second actuators jointly deflect the optical element;
B) If $\alpha_1 > b_1 - \alpha$ then $\alpha_2 < a_2 + \alpha$ and the first and second actuators jointly deflect the optical element;
C If $a_1 + \alpha_1 \leq b_1 - \alpha$ the first actuator deflects the optical element; and
D) If $a_2 + \alpha \leq \alpha_2 \leq b_2 - \alpha$ the second actuator deflects the optical element.

2. The apparatus of claim 1, wherein:
the first and second actuators are of identical design; and apart from batch variation, $a_1 = a_2$, $b_1 = b_2$ hold true.

3. The apparatus of claim 1, wherein for all values $0 \leq t \leq 1$ of a parameter t:
from the control $\alpha_1 = t(a_1 + \alpha) + (1-t)a_1$ there follows the control $\alpha_2 = (1-t)(b_2 - \alpha) + tb_2$;
from the control $\alpha_1 = tb_1 + (1-t)(b_1 - \alpha)$ there follows the control $\alpha_2 = (1-t)a_2 + t(a_2 + \alpha)$; and
from the control $\alpha_1 = (1-t)(a_1 + \alpha) + t(b_1 - \alpha)$ there follows the control $\alpha_2 = (1-t)b_2 + ta_2$.

4. The apparatus of claim 1, wherein the degree of freedom is a location of the optical element.

5. The apparatus of claim 4, wherein the first actuator is controllable by an additional first control range, the second actuator is controllable by an additional second control range, and a velocity of the optical element is controllable as an additional degree of freedom of the optical element by control of the controls in the additional control ranges.

6. The apparatus of claim 5, wherein in cases A and B the control is effectable by the additional control ranges so that the velocity of the first actuator is equal to the velocity of the second actuator.

7. The apparatus of claim 6, wherein the first actuator is controllable by a further additional first control range, the second actuator is controllable by a further additional second control range, and an acceleration of the optical element is controllable as a further additional degree of freedom of the optical element by control of the controls in the further additional control ranges.

8. The apparatus of claim 7, wherein, if $\alpha_1 = a_1 + \alpha$ or $\alpha_1 = \beta_1 - \alpha$ for the first actuator, the control is effectable by the further additional control ranges so that the acceleration of the first actuator is equal to the acceleration of the second actuator.

9. The apparatus of claim 1, wherein:
the manipulator comprises an outer mount and an inner mount;
the first actuator comprises a first shear piezo;
the second actuator comprises a second shear piezo;
the inner mount holds the optical element;
the first and second shear piezos are connected to the outer mount; and
the optical element is deflectable via frictional engagement between the first and second shear piezos and the inner mount and shearing of the shear piezos in the direction of the degree of freedom.

10. The apparatus of claim 9, wherein:
the first piezo comprises a first stroke piezo;
the second piezo comprises a second stroke piezo;
the frictional engagement is effectable by stroke movement of at least one of the first and second stroke piezos in an orthogonal direction relative to the direction of the degree of freedom.

11. The apparatus of claim 9, wherein the control range corresponds to voltages usable to shear at least one of the first and second shear piezos, and the voltage $b_2$ corresponds to the maximum shearing of the at least one of the shear piezos.

12. The apparatus of claim 5, wherein:
the manipulator comprises an outer mount and an inner mount;
the first actuator comprises a first shear piezo;
the second actuator comprises a second shear piezo;
the inner mount holds the optical element;
the first and second shear piezos are connected to the outer mount;
the optical element is deflectable via frictional engagement between the first and second shear piezos and the inner mount and shearing of the shear piezos in the direction of the degree of freedom; and
the additional control range corresponds to velocities, usable for the velocity of the shearing, of voltage changes of at least one of the shear piezos.

13. The apparatus of claim 7, wherein:
the manipulator comprises an outer mount and an inner mount;
the first actuator comprises a first shear piezo;
the second actuator comprises a second shear piezo;
the inner mount holds the optical element;
the first and second shear piezos are connected to the outer mount;
the optical element is deflectable via frictional engagement between the first and second shear piezos and the inner mount and shearing of the shear piezos in the direction of the degree of freedom; and
the further additional control range corresponds to the velocity of voltage changes that is usable for the acceleration of the shearing of at least one of the shear piezos.

14. The apparatus of claim 10, wherein:
the first stroke piezo is controllable by a third control range with voltages usable for the stroke movement;
the first stroke piezo is controllable by an additional third control range with velocities of voltage changes that are usable for the stroke movement;
the first stroke piezo is controllable by a further additional third control range with accelerations of voltage changes that are usable for the stroke movement;
the second stroke piezo is controllable by a fourth control range with voltages usable for the stroke movement;
the second stroke piezo is controllable by an additional fourth control range with velocities of voltage changes that are usable for the stroke movement; and
the second stroke piezo is controllable by a further additional fourth control range with accelerations of voltage changes that are usable for the stroke movement.

15. The apparatus of claim 1, wherein the manipulator comprises memory configured to hold one or more control margins.

16. The apparatus of claim 1, wherein the manipulator comprises a sensor configured to determine a relative or absolute deflection of the optical element in the direction of the degree of freedom, and the manipulator comprises a regulation device configured to process signals selected from the group consisting of signals of the sensor, signals of the control device and combinations thereof.

17. A method, comprising:
providing the apparatus of claim 1; and
moving the optical element by:
(i) defining the convolution parameter $\alpha$;
(ii) deflecting the optical element solely by the first actuator in the direction of the degree of freedom by increasing the first variable $\alpha_1$ in the range $(\alpha_1+\alpha, b_1-\alpha)$ toward the value $b_1-\alpha$;
(iii) controlling the first variable $\alpha_1$ with $b_1-\alpha$ and controlling the second variable $\alpha_2$ with $a_2$;
(iv) deflecting the optical element by the first actuator and the second actuator in the direction of the degree of freedom by increasing the first variable toward the value $b_1$ and the second variable $\alpha_2$ in the range $(a_2, b_2)$ toward the value $a_2+\alpha$,
(v) controlling the first variable $\alpha_1$ with $b_1$ and controlling the second variable $\alpha_2$ with $a_2+\alpha$,
(vi) deflecting the optical element solely by the second actuator by further increasing the second variable $\alpha_2$ in the range $(a_2+\alpha, b_2-\alpha)$ toward the value $b_2-\alpha$,
(vii) controlling the second variable $\alpha_2$ with $b_2-\alpha$ and control of the first variable $\alpha_1$ with $a_1$,
(viii) deflecting the optical element by the first actuator and the second actuator in the direction of the degree of freedom by increasing the second variable toward the value $b_2$ and the first variable $\alpha_1$ in the range $(a_1, a_1+\alpha)$ toward the value $a_1+\alpha$,
(ix) control the second variable $\alpha_2$ with $b_2$, and
(x) deflecting of the optical element solely by the first actuator in the direction of the degree of freedom by further increasing the first variable $\alpha_1$ in the range $(a_1+\alpha, b_1-\alpha)$ toward the value $b_1-\alpha$.

18. A method, comprising:
providing the apparatus of claim 14; and
calibrating the actuators of the manipulator by:
for the actuators, determining deflections and/or velocities and/or accelerations of the optical element depending on the controls from the first control range, the additional first control range, the further additional first control range, the third control range, the additional third control range and/or the further additional third control range;
adapting the controls of the actuators in the first control range, the additional first control range and/or the further additional first control range so that the deflection and/or velocity and/or acceleration of the optical element is not altered during the change of the deflection of the optical element by the first to the second actuator; and
adapting the controls of the actuators in the third control range, the additional third control range and/or the further additional third control range to not to induce any deflection and/or velocity and/or acceleration of the optical element during the change from the production or release of the frictional engagement by the stroke piezos of the first actuator to the production or release of the frictional engagement by the stroke piezos of the second actuator orthogonally with respect to the degree of freedom.

19. An apparatus, comprising: an optical element,
a manipulator configured to the optical element in a degree of freedom, the manipulator comprising:
a finite number n of actuators configured to deflect the optical element in a direction of the degree of freedom and a direction counter to the direction of the degree of freedom, each of the actuators being controllable by a variable $\alpha_i$, i=1, ..., n from control ranges $[a_i, b_i]$, i=1, ..., n with maximum deflections of the optical element in the direction of the degree of freedom by the respective control with $b_i$, i=1, ..., n and minimum deflections in the direction of the degree of freedom by the respective control $a_i$, i=1, ..., n; and
a control device configured to control the actuators in their control ranges,
wherein
the apparatus is microlithography projection exposure device; and $$\text{if } \left(1-\frac{m}{n}\right)a_1 + \frac{m}{n}b_1 \leq \alpha_1 < \left(1-\frac{m+1}{n}\right)a_1 + \frac{m+1}{n}b_1$$

for a natural number m where $1 \leq m < n$, then $$\left(1-frac\left(\frac{m+i-1}{n}\right)\right)a_i + frac\left(\frac{m+i-1}{n}\right)b_i \leq$$
$$\alpha_{s(i)} < \left(1-frac\left(\frac{m+i-1}{n}\right)\right)a_i + frac\left(\frac{m+i-1}{n}\right)b_i$$

for an arbitrarily chosen permutation s of the numbers $\{2, \ldots, n\}$.

20. A method, comprising:
providing the apparatus of claim 19; and
moving the optical element by:
producing a frictional engagement between the shear piezos of a subset T of the actuators and the inner mount by first stroke movements of the stroke piezos of the actuators of said subset,
synchronously shearing of the subset T of shear piezos in the direction of the degree of freedom and associated deflection of the optical element in the direction of the degree of freedom;
synchronously shearing of the shear piezos of the actuators which do not belong to said subset T of actuators counter to the direction of the degree of freedom;
ending the synchronous shearing the shear piezos if: one of the shear piezos of the subset T of actuators has attained its maximum shearing in the direction of the degree of freedom; or one of the shear piezos which does not belong to said subset T of actuators has attained its minimum shearing in the direction of the degree of freedom;
producing a frictional engagement between inner mount and the shear piezo of the actuator which does not belong to the subset T of actuators and whose shear piezo has the most minimum shearing in the direction of the degree of freedom as a result of a first stroke movement of the stroke piezo of said actuator; and releasing the frictional engagement between inner mount and the shear piezo of the actuator which belongs to the subset T of actuators and whose shear piezo has the most maximum shearing in the direction of the degree of freedom as a result of a second stroke movement—opposite to the first stroke movement—of the stroke piezo of said actuator.

* * * * *

UNITED STATES PATENT AND TRADEMARK OFFICE
CERTIFICATE OF CORRECTION

| | | |
|---|---|---|
| PATENT NO. | : 8,879,046 B2 | Page 1 of 1 |
| APPLICATION NO. | : 14/085572 | |
| DATED | : November 4, 2014 | |
| INVENTOR(S) | : Karl-Eugen Aubele et al. | |

It is certified that error appears in the above-identified patent and that said Letters Patent is hereby corrected as shown below:

In the Specification

Col. 4, line 64, delete "$(b_1\text{-}a)$" and insert -- $(b_1\text{-}\alpha)$ --.

Col. 8, lines 22 and 23, delete "to ward" and insert -- toward --, and make lines 23-24 a continuation of line 22.

Col. 10, line 27, delete "an a" and insert -- a --.

In the Claims

Col. 22, line 65, Claim 1, delete "$a_2$" and insert -- $\alpha_2$ --.

Col. 23, line 37, Claim 3, delete "$(a_i\text{+}\alpha)$" and insert -- $(a_1\text{+}\alpha)$ --.

Col. 26, line 19, Claim 19, delete "wherein" and insert -- wherein: --.

Col. 26, line 20, Claim 19, delete "is" and insert -- is a --.

Signed and Sealed this
Twenty-fourth Day of February, 2015

Michelle K. Lee
*Deputy Director of the United States Patent and Trademark Office*